United States Patent
Lin et al.

(10) Patent No.: US 9,478,631 B2
(45) Date of Patent: Oct. 25, 2016

(54) VERTICAL-GATE-ALL-AROUND DEVICES AND METHOD OF FABRICATION THEREOF

(71) Applicant: Taiwan Semiconductor Manufacturing Company Limited, Hsinchu (TW)

(72) Inventors: Cheng-Tung Lin, Hsinchu County (TW); Teng-Chun Tsai, Hsinchu (TW); Li-Ting Wang, Hsinchu (TW); De-Fang Chen, Hsinchu (TW); Chih-Tang Peng, Hsinchu County (TW); Hung-Ta Lin, Hsinchu (TW); Chien-Hsun Wang, Hsinchu (TW); Huang-Yi Huang, Hsin-chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/295,388

(22) Filed: Jun. 4, 2014

(65) Prior Publication Data

US 2015/0357432 A1    Dec. 10, 2015

(51) Int. Cl.

| | |
|---|---|
| *H01L 29/66* | (2006.01) |
| *H01L 29/775* | (2006.01) |
| *H01L 27/092* | (2006.01) |
| *H01L 21/8238* | (2006.01) |
| *B82Y 10/00* | (2011.01) |
| *B82Y 40/00* | (2011.01) |
| *H01L 29/423* | (2006.01) |
| *H01L 29/06* | (2006.01) |
| *H01L 29/41* | (2006.01) |

(52) U.S. Cl.
CPC ......... *H01L 29/66439* (2013.01); *B82Y 10/00* (2013.01); *B82Y 40/00* (2013.01); *H01L 21/823814* (2013.01); *H01L 21/823885* (2013.01); *H01L 27/092* (2013.01); *H01L 29/0676* (2013.01); *H01L 29/413* (2013.01); *H01L 29/42376* (2013.01); *H01L 29/775* (2013.01); *H01L 21/823842* (2013.01)

(58) Field of Classification Search
None
See application file for complete search history.

(56) References Cited

U.S. PATENT DOCUMENTS

| | | | | |
|---|---|---|---|---|
| 5,338,960 | A  * | 8/1994 | Beasom | .......... H01L 21/823814 257/327 |
| 6,020,239 | A  * | 2/2000 | Gambino | .......... H01L 29/66666 257/E21.41 |
| 6,287,951 | B1 * | 9/2001 | Lucas | ............... H01L 21/76801 257/E21.507 |
| 2006/0273389 | A1* | 12/2006 | Cohen | .................... B82Y 10/00 257/331 |
| 2014/0315366 | A1* | 10/2014 | Wu | ........................ H01L 23/485 438/300 |

FOREIGN PATENT DOCUMENTS

KR   20070029799   3/2007

OTHER PUBLICATIONS

Korean Office Action; Application No. 10-2014-0193962; dated Feb. 26, 2016.

* cited by examiner

*Primary Examiner* — Kimberly Rizkallah
*Assistant Examiner* — Bo Bin Jang
(74) *Attorney, Agent, or Firm* — Jones Day

(57) ABSTRACT

Structures and methods are provided for forming bottom source/drain contact regions for nanowire devices. A nanowire is formed on a substrate. The nanowire extends substantially vertically relative to the substrate and is disposed between a top source/drain region and a bottom source/drain region. A first dielectric material is formed on the bottom source/drain region. A second dielectric material is formed on the first dielectric material. A first etching process is performed to remove part of the first dielectric material and part of the second dielectric material to expose part of the bottom source/drain region. A second etching process is performed to remove part of the first dielectric material under the second dielectric material to further expose the bottom source/drain region. A first metal-containing material is formed on the exposed bottom source/drain region. Annealing is performed to form a bottom contact region.

19 Claims, 21 Drawing Sheets

VERTICAL-GATE-ALL-AROUND DEVICES AND METHOD OF FABRICATION THEREOF

BACKGROUND

The technology described in this disclosure relates generally to semiconductor devices and more particularly to fabrication of semiconductor devices.

As feature sizes of semiconductor devices continue to shrink (e.g., into a sub 50 nm regime), various problems, such as short-channel effects and poor sub-threshold characteristics, often become severe in traditional planar devices. Novel device geometries, such as gate-all-around (GAA) devices, with enhanced performance are needed to push toward higher packing densities in devices and circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
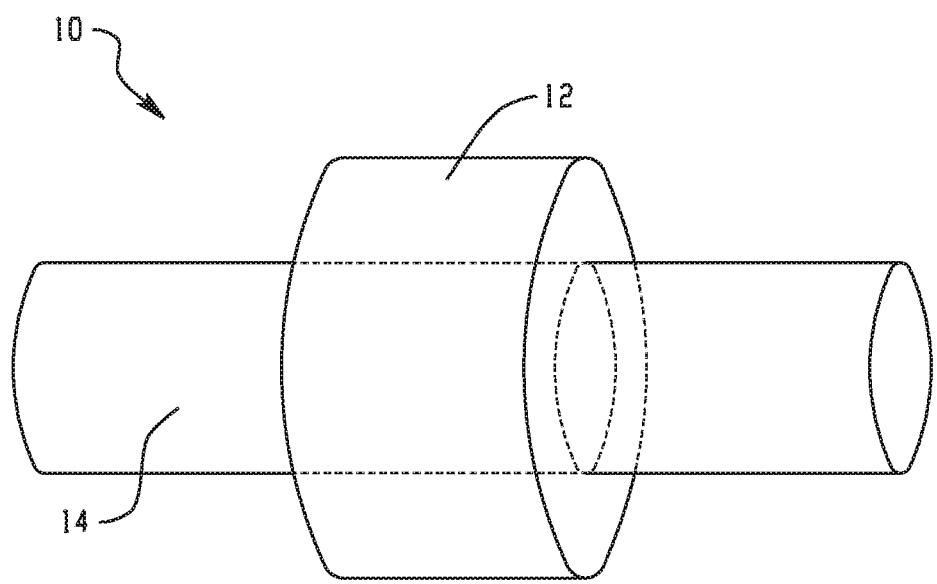
FIG. 1 depicts an example diagram showing a gate-all-around (GAA) device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 depicts an example diagram showing a gate-all-around (GAA) device structure, in accordance with some embodiments. As shown in FIG. 1, the GAA device structure 10 includes a gate layer 12 and a channel structure 14, where the gate layer 12 surrounds the channel structure 14. Specifically, the GAA device structure 10 can be implemented to fabricate a GAA device, e.g., a nanowire transistor.

Figure 2:
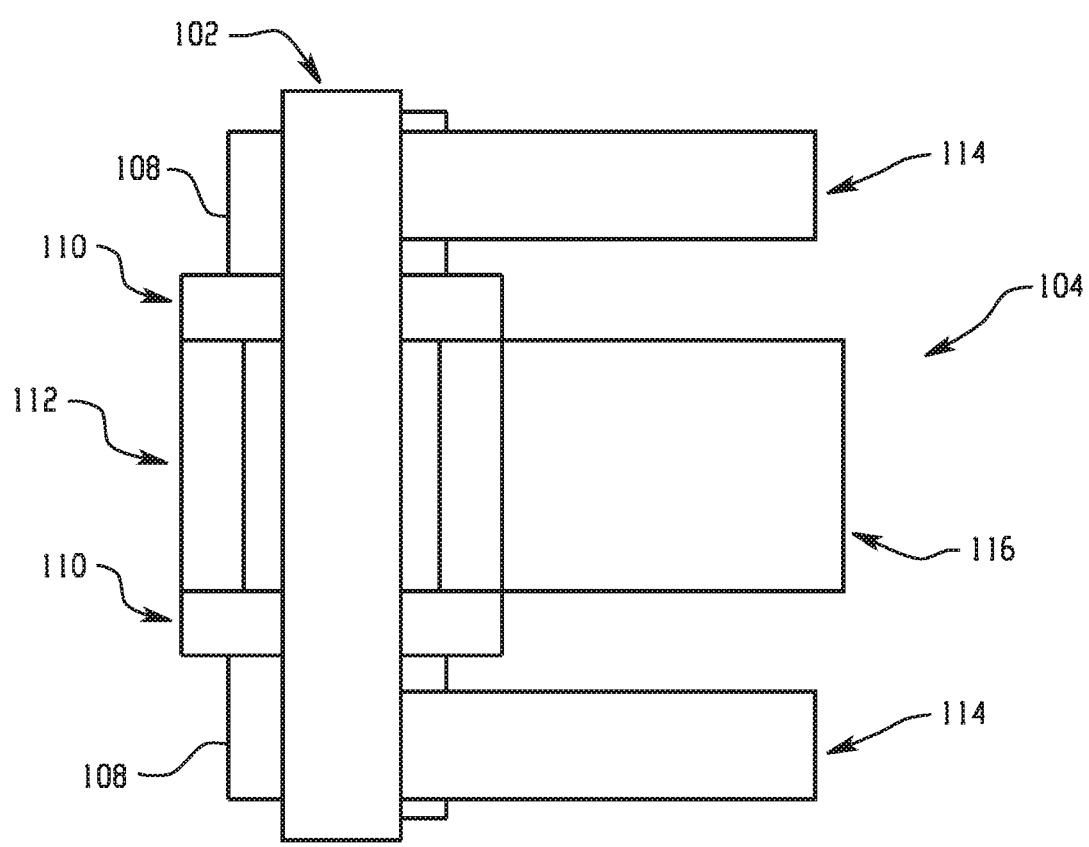
FIG. 2 depicts an example diagram showing a nanowire transistor, in accordance with some embodiments.

FIG. 2 depicts an example diagram showing a nanowire transistor, in accordance with some embodiments. As shown in FIG. 2, a nanowire 102 is formed to fabricate a transistor 104. A channel region is formed in the nanowire 102 between source/drain regions 108. Spacers 110 are formed adjacent to one or more gate layers 112 on the nanowire 102. Source/drain contacts 114 are formed on the source/drain regions 108. In addition, a gate contact 116 is formed on the gate layers 112 that surround at least part of the nanowire 102. For example, the diameter of the nanowire 102 is 6 nm. In certain embodiments, the small size of the nanowire 102 results in volume inversion of the channel 104 and thus reduces short-channel effects.

As shown in FIG. 2, the nanowire transistor 104 corresponds to a vertical GAA device fabricated on a substrate. The nanowire 102 extends substantially vertically relative to the substrate. For example, the substrate includes silicon, silicon germanium, germanium, one or more III-V materials (e.g., InP, GaAs, AlAs, InAs, InAlAs, InGaAs, InSb, GaSb, and/or InGaSb), or other suitable materials. The nanowire 102 includes silicon, silicon germanium, germanium, one or more III-V materials (e.g., InP, GaAs, AlAs, InAs, InAlAs, InGaAs, InSb, GaSb, and/or InGaSb), or other suitable materials. In some embodiments, the nanowire transistor 104 corresponds to an n-type transistor or a p-type transistor fabricated using the nanowire 102 through processes compatible with a complementary-metal-oxide-semiconductor (CMOS) process flow.

FIG. 3(A)-FIG. 8(E) depict example diagrams showing a process for fabricating multiple nanowire transistors on a substrate where bottom source/drain contact regions are formed at an early stage of the process, in accordance with some embodiments. FIG. 9(A)-FIG. 11(E) depict example diagrams showing another process for fabricating multiple nanowire transistors on a substrate where bottom source/drain contact regions are formed at a late stage of the process, in accordance with some embodiments. As shown in FIG. 12(A) and FIG. 12(B), the bottom source/drain contact regions formed at a late stage of a fabrication process have larger contact areas which results in smaller contact resistance, compared with the bottom source/drain contact regions formed at an early stage of a fabrication process. In addition, when the bottom source/drain contact regions are formed at a late stage of the fabrication process, the bottom source/drain contact regions do not need to ensure the gate structure forming process and the doping activation annealing, and/or the oxide growth.

Figure 3A:
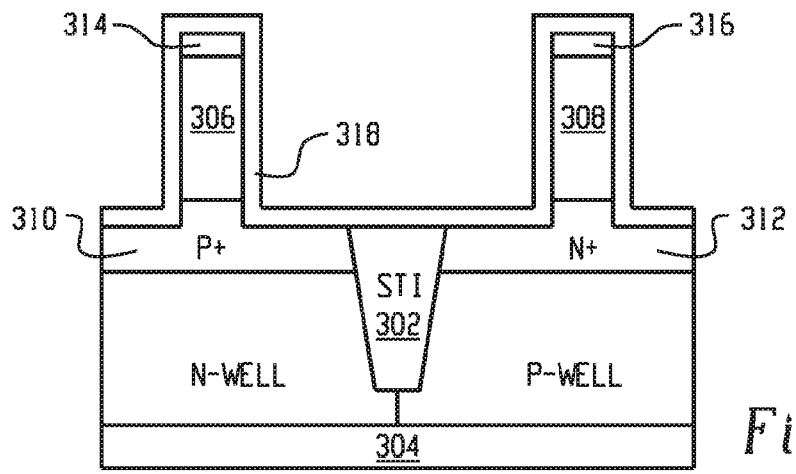
FIG. 3(A)-FIG. 8(E) depict example diagrams showing a process for fabricating multiple nanowire transistors on a substrate where bottom source/drain contact regions are formed at an early stage of the process, in accordance with some embodiments.

FIG. 3(A)-FIG. 3(F) depict example diagrams showing a process for forming bottom source/drain contact regions, in accordance with some embodiments. As shown in FIG. 3(A), nanowires 306 and 308 are formed on a substrate 304, where a shallow-trench-isolation (STI) structure 302 separates the nanowires 306 and 308. Bottom source/drain regions 310 and 312 are formed for the nanowires 306 and 308 respectively.

Any known fabrication processes can be implemented to fabricate the device structure as shown in FIG. 3(A). For example, the STI structure 302 is formed on the substrate 304, e.g., through lithography, chemical-mechanical planarization/polishing (CMP) and etching (e.g., a single etching process, or multiple etching processes). The STI structure 302 includes a dielectric material (e.g., oxides) formed through chemical vapor deposition (CVD), plasma enhanced chemical vapor deposition (PECVD), physical vapor deposition (PVD), sputtering, atomic layer deposition (ALD), or other suitable processes.

The nanowires 306 and 308 are fabricated through lithography and etching (e.g., dry etching or wet etching). In some embodiments, an annealing process is carried out for nanowires 306 and 308. For example, the annealing process is performed in hydrogen (e.g., with a pressure in a range of about 7 torr to about 600 torr) at a temperature in a range of about 600° C. to about 1000° C. The nanowires 306 and 308 are smoothed during the annealing process to become, e.g., elliptical shaped or cylindrical shaped. In some embodiments, the nanowires 306 and 308 are oxidized partially and the formed oxides are stripped (e.g., through etching) to thin down the nanowires 306 and 308.

The bottom source/drain regions 310 and 312 are formed through ion implantation (e.g., along a direction perpendicular to the substrate 304. For example, the bottom source/drain region 310 is p-doped, and the bottom source/drain region 312 is n-doped. Hard-mask materials 314 and 316 protect a top part of the nanowires 306 and 308 respectively from the ion implantation.

In certain embodiments, ion implantation is carried out (e.g., along a direction not perpendicular to the substrate 304) to form doped channel regions in the nanowires 306 and 308. For example, a channel region is n-doped for fabricating an accumulation-mode transistor. In another example, a channel region is p-doped for fabricating an inversion-mode transistor. In some embodiments, the channel regions in the nanowires 306 and 308 are not doped.

Figure 3B:
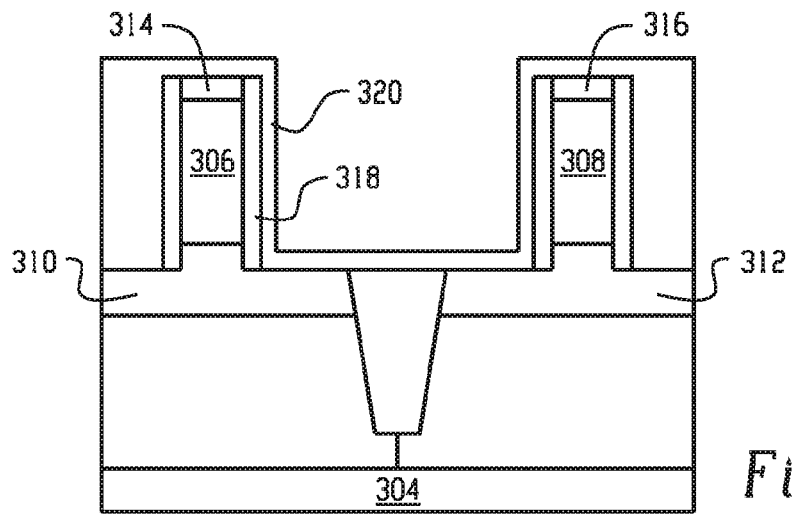
Figure 3C:
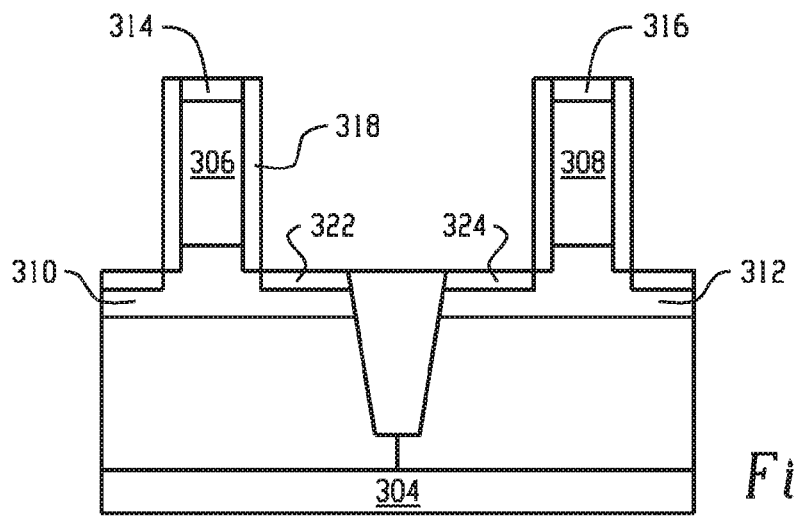

As shown in FIG. 3(A), a spacer material 318 (e.g., silicon nitride) is formed, e.g., through deposition. Part of the spacer material 318 on top of the nanowires 306 and 308 is removed (e.g., through etching), and a metal-containing material 320 is formed, as shown in FIG. 3(B). For example, the metal-containing material 320 is formed through chemical vapor deposition (CVD), plasma enhanced chemical vapor deposition (PECVD), physical vapor deposition (PVD), atomic layer deposition (ALD), or other suitable processes. The deposition temperature of the metal-containing material 320 is in a range of about 100° C. to about 1000° C. The metal-containing material 320 includes Ti or Ni(Pt) with a TiN cap layer. The thickness of the metal-containing material 320 is in a range of about 0.5 nm to 100 nm. An annealing process is performed to form bottom source/drain contact regions 322 and 324 associated with the nanowires 306 and 308 respectively. For example, rapid thermal annealing is performed at a temperature in a range of about 100° C. to 1000° C. for a time period in a range of about 0.01 second to about 10 seconds. In another example, millisecond annealing is performed at a temperature in a range of about 500° C. to 1200° C. The bottom contact regions 322 and 324 (e.g., silicides) are formed through a self-aligned silicidation process of the bottom source/drain regions 310 and 312, respectively. In some embodiments, the un-reacted metal-containing material 320 is removed, e.g., through wet etching.

Figure 3D:
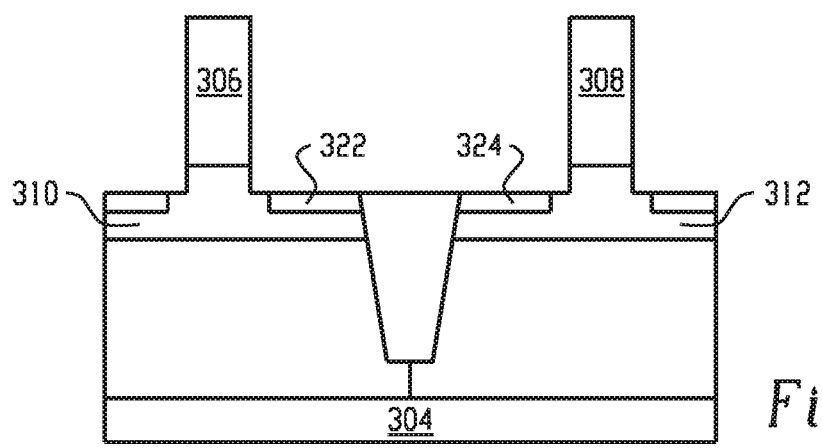
Figure 3E:
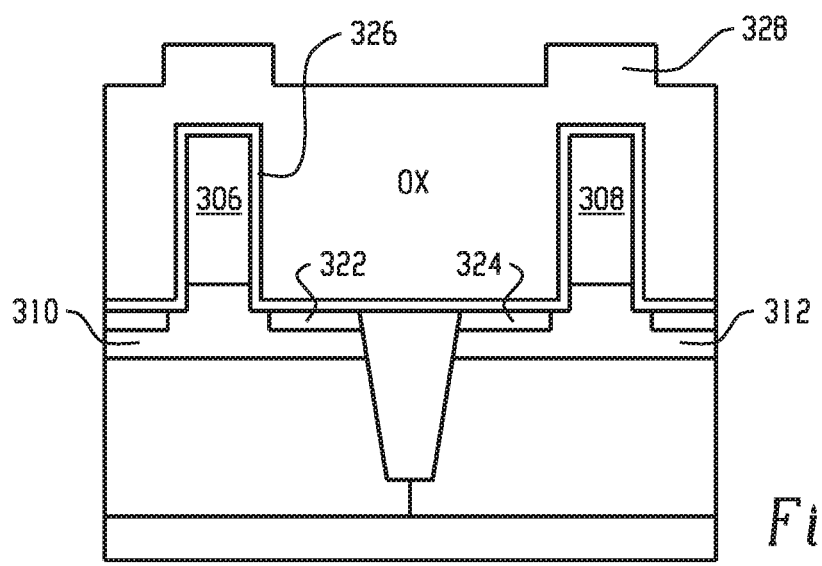
Figure 3F:
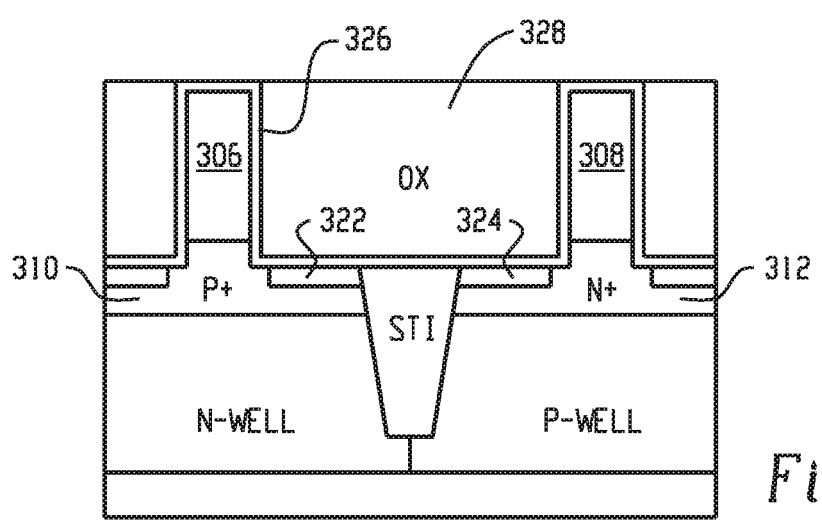

As shown in FIG. 3(D), the remaining spacer material 318 and the hard-mask materials 314 and 316 are removed, e.g., through etching. A contact-etch-stop layer (CESL) 326 and a dielectric material 328 (e.g., oxides) are formed on the wafer, as shown in FIG. 3(E). A CMP process is performed to remove part of the dielectric material 328 and stops at the CESL layer 326, as shown in FIG. 3(F).

Figure 4A:
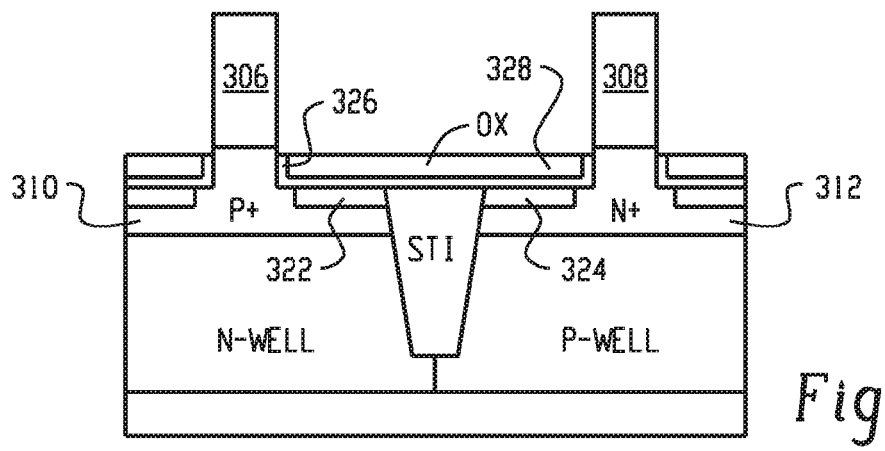
Figure 4B:
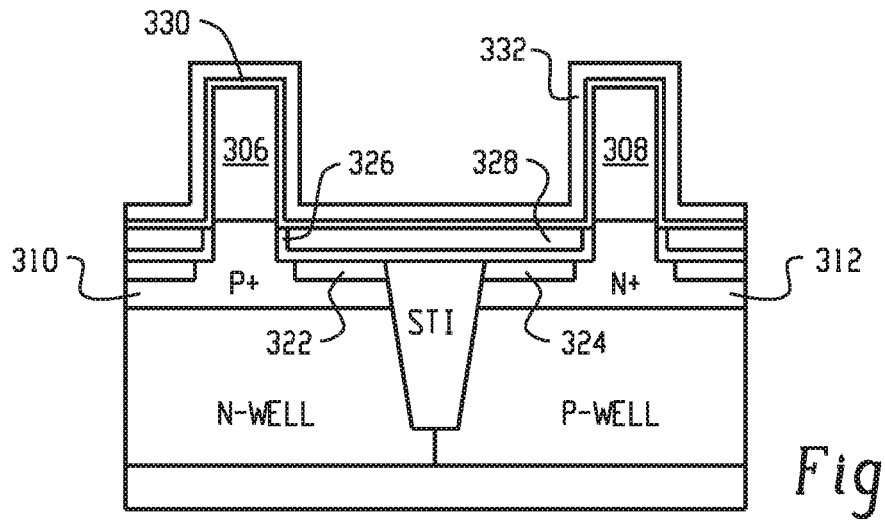

FIG. 4(A)-FIG. 4(F) depict example diagrams showing a process for forming gate structures, in accordance with some embodiments. As shown in FIG. 4(A), part of the dielectric material 328 and part of the CESL 326 are removed, e.g., through dry etching. A gate dielectric material 330 including an interfacial layer and a high-k dielectric material is formed on the wafer, and a p-type-work-function metal material 332 is formed on the gate dielectric material 330, as shown in FIG. 4(B). For example, the high-k dielectric material includes $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, or other suitable materials. As an example, the p-type-work-function-metal material 332 includes titanium-nitride-containing materials, aluminum-containing materials, or other suitable materials.

Figure 4C:
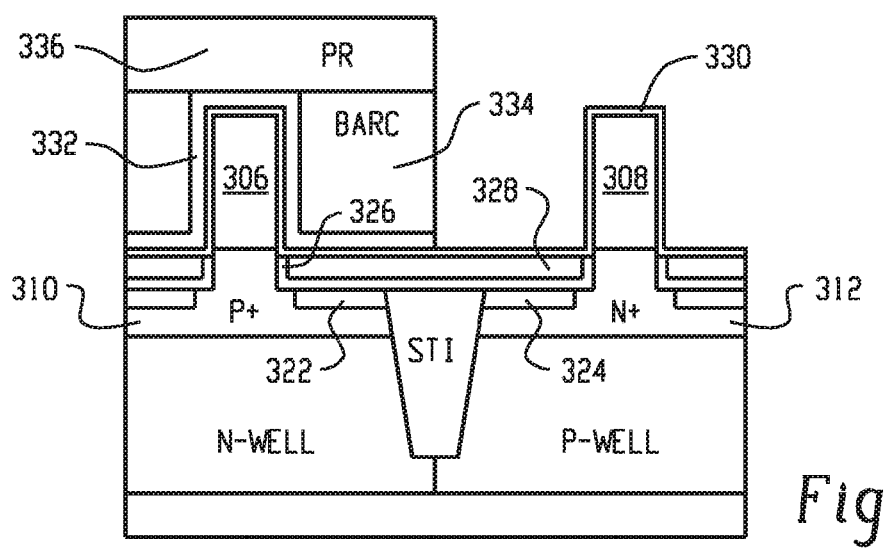
Figure 4D:
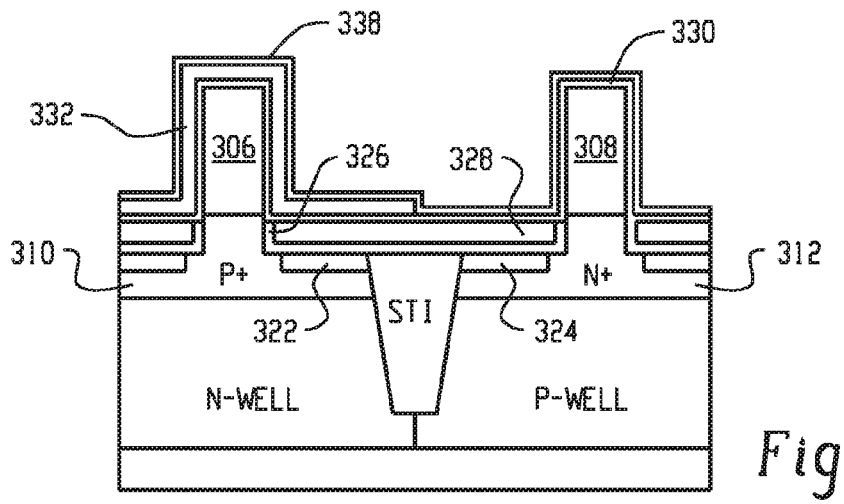
Figure 4E:
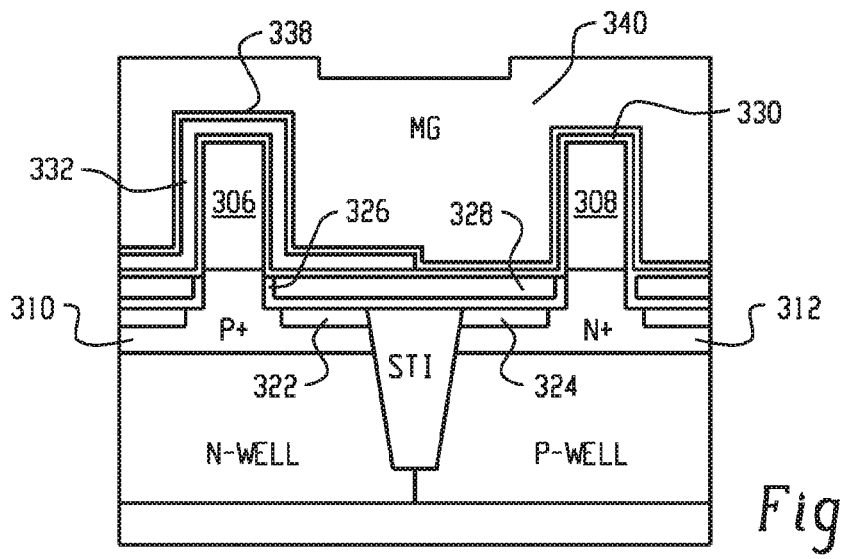
Figure 4F:
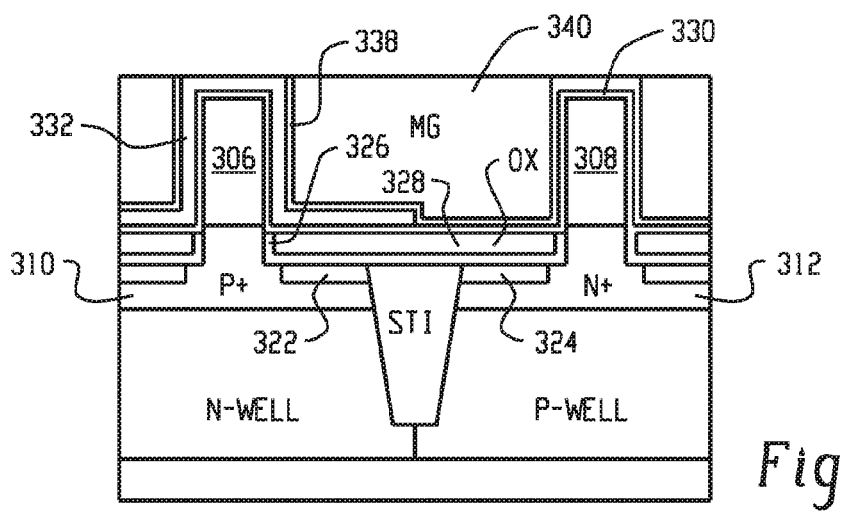

A BARC layer 334 and a photoresist layer 336 are formed on the wafer, and part of the BARC layer 334 and part of the photoresist layer 336 are removed to expose part of the p-type-work-function-metal material 332. The exposed p-type-work-function-metal material 332 is removed, e.g., through etching, as shown in FIG. 4(C). The remaining BARC layer 334 and the remaining photoresist layer 336 are removed. An n-type-work-function-metal material 338 is formed on the wafer, as shown in FIG. 4(D). For example, the n-type-work-function-metal material 338 includes titanium-nitride-containing materials, lanthanum-containing materials, or other suitable materials. A gate contact material 340 is formed on the n-type-work-function-metal material 338, as shown in FIG. 4(E). For example, the gate contact material 340 includes aluminum, tungsten, cobalt, copper, or other suitable materials. As shown in FIG. 4(F), a CMP process is carried out to remove part of the gate contact material 340 and part of the n-type-work-function-metal material 338.

Figure 5A:
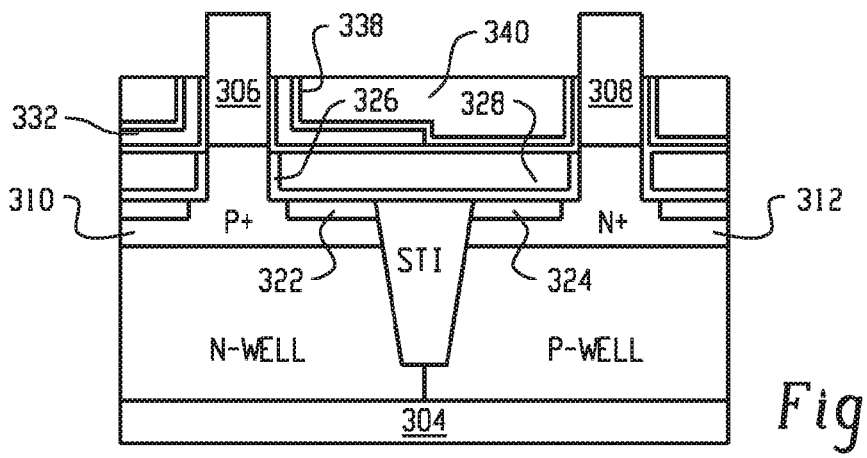
Figure 5B:
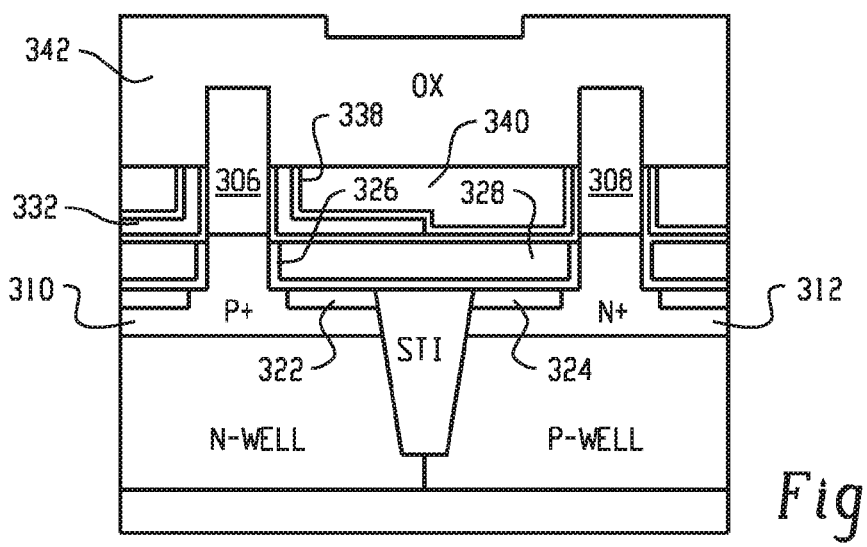
Figure 5C:
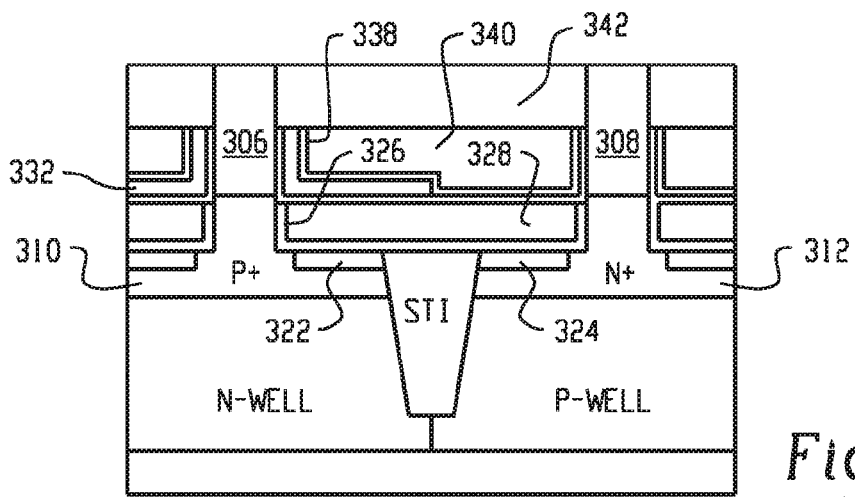
Figure 5D:
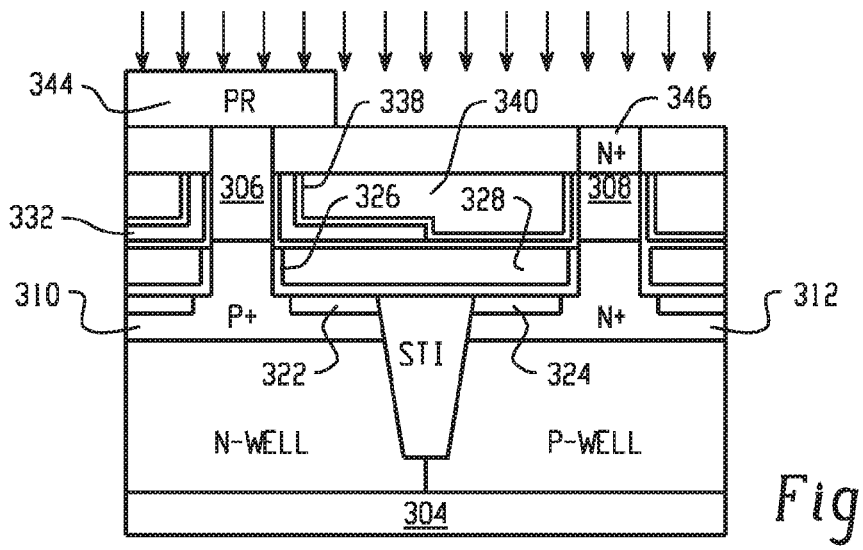

FIG. 5(A)-FIG. 5(F) depict example diagrams showing a process for forming top source/drain regions, in accordance with some embodiments. Part of the gate contact material 340, part of the n-type-work-function-metal material 338 and part of the p-type-work-function-metal material 332 are removed, e.g., through dry etching, as shown in FIG. 5(A). As shown in FIG. 5(B), a dielectric material 342 (e.g., oxides) is formed on the wafer. A CMP process is performed to remove part of the dielectric material 342 and stops at the top surfaces of the nanowires 306 and 308, as shown in FIG. 5(C). A photoresist layer 344 is formed on the wafer and part of the photo resist layer 344 is removed to expose the nanowire 308. Ion implantation is performed (e.g., along a direction perpendicular to the substrate 304) to form an n-doped top source/drain region 346 in a top part of the nanowire 308, as shown in FIG. 5(D). The remaining photoresist layer 344 is removed.

Figure 5E:
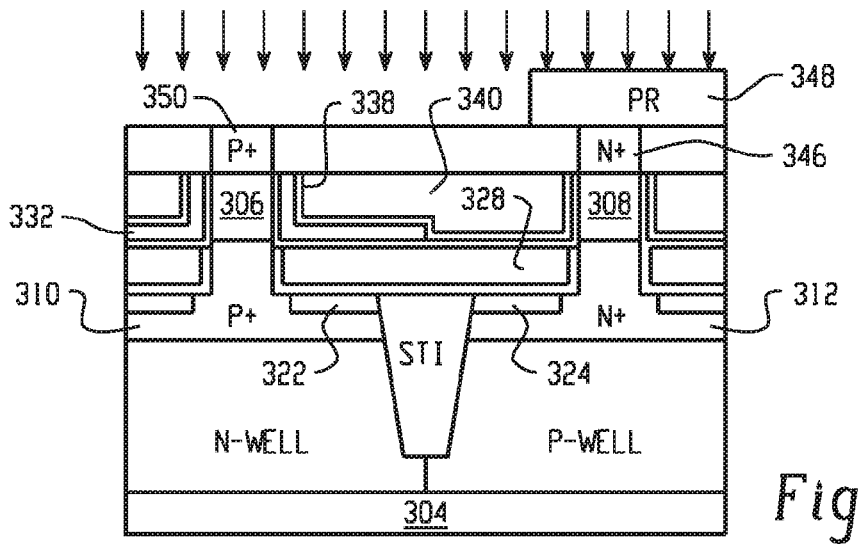
Figure 5F:
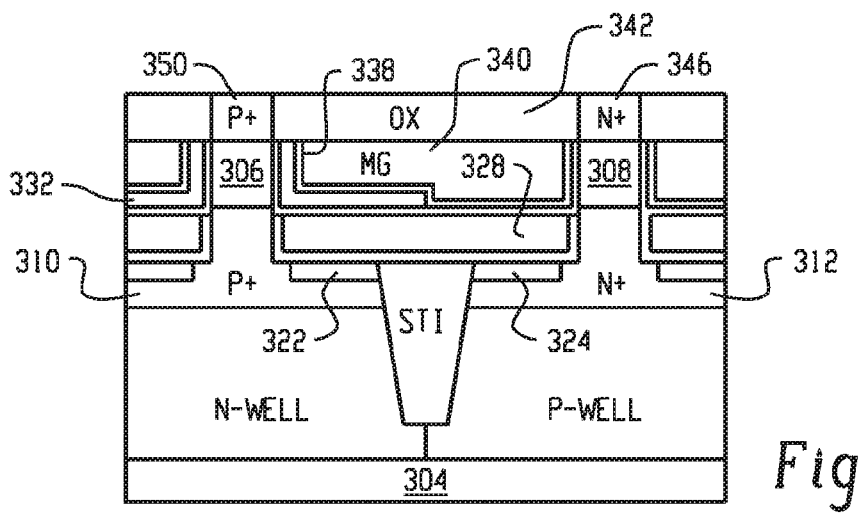

As shown in FIG. 5(E), another photoresist layer 348 is formed on the wafer and part of the photo resist layer 348 is removed to expose the nanowire 306. Ion implantation is performed (e.g., along a direction perpendicular to the substrate 304) to form a p-doped top source/drain region 350 in a top part of the nanowire 306. The remaining photoresist layer 348 is removed, as shown in FIG. 5(F). A high-temperature annealing process is performed to activate dopants in the top source/drain regions 346 and 350 (e.g., as well as the bottom source/drain regions 310 and 312), in some embodiments.

Figure 6A:
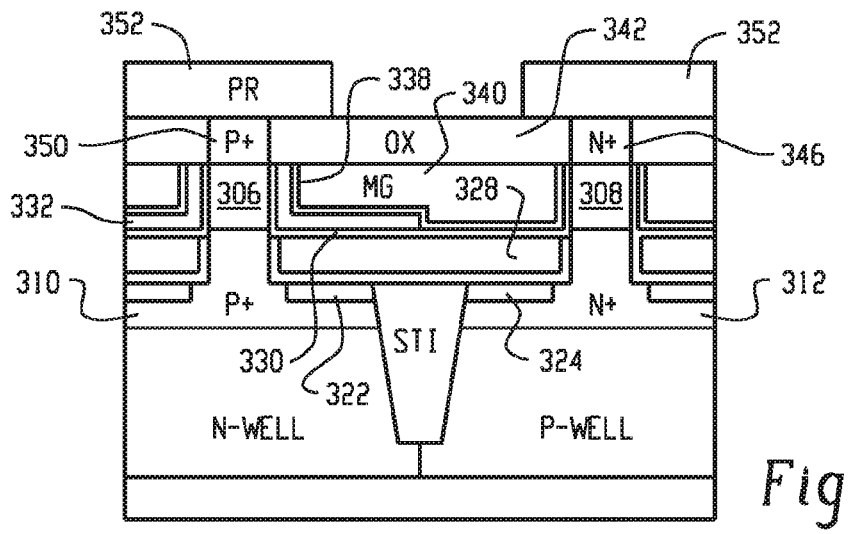
Figure 6B:
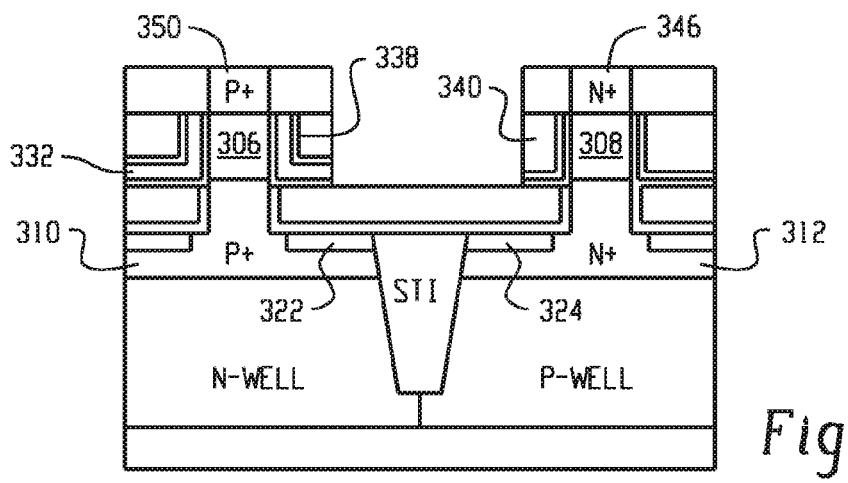
Figure 6C:
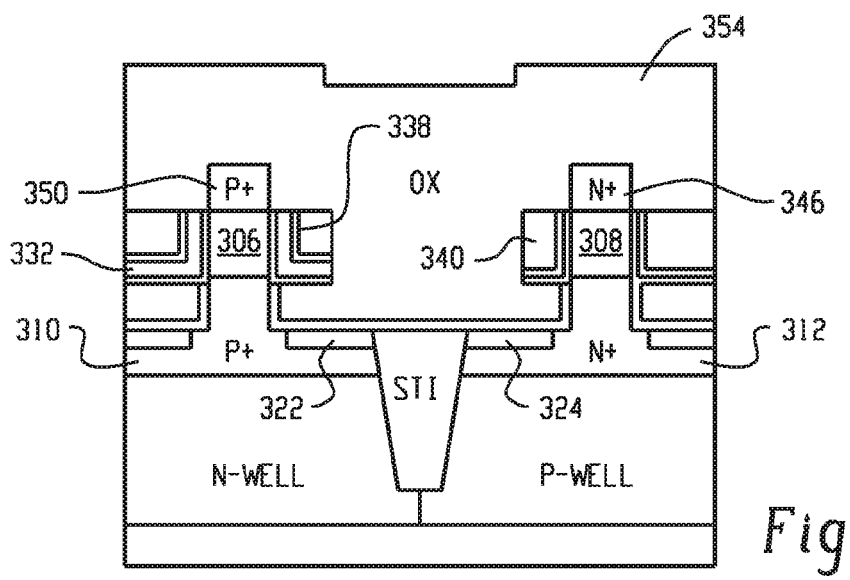
Figure 6D:
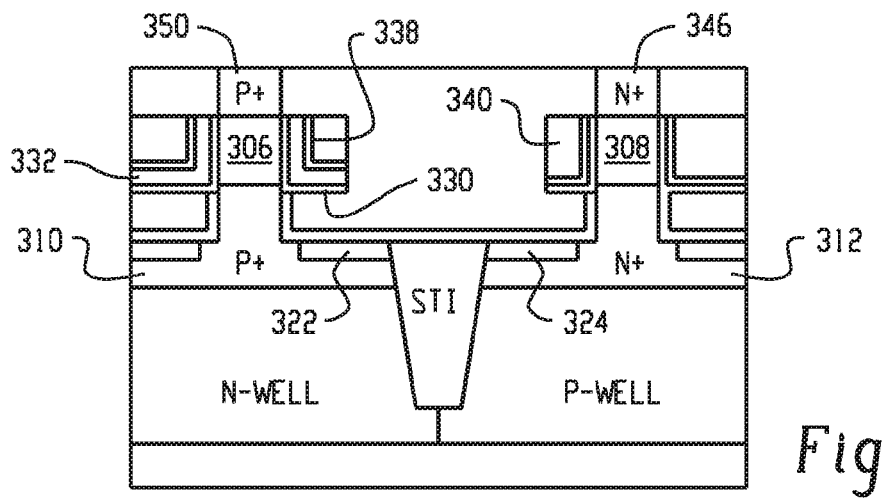

FIG. 6(A)-FIG. 6(F) depict example diagrams showing a process for forming top source/drain contact regions, in accordance with some embodiments. As shown in FIG. 6(A), a photoresist layer 352 is formed on the wafer, and part of the photoresist 352 is removed to expose part of the dielectric material 342. The exposed dielectric material 342, part of the gate contact material 340, part of the n-type-work-function-metal material 338, part of the p-type-work-function-metal material 332, and part of the gate dielectric material 330 are removed, e.g., through etching. The remaining photoresist layer 352 is removed, as shown in FIG. 6(B). A dielectric material 354 (e.g., oxides) is formed on the wafer, as shown in FIG. 6(C). A CMP process is performed to remove part of the dielectric material 354 and stops at the top surfaces of the top source/drain regions 350 and 346, as shown in FIG. 6(D).

Figure 6E:
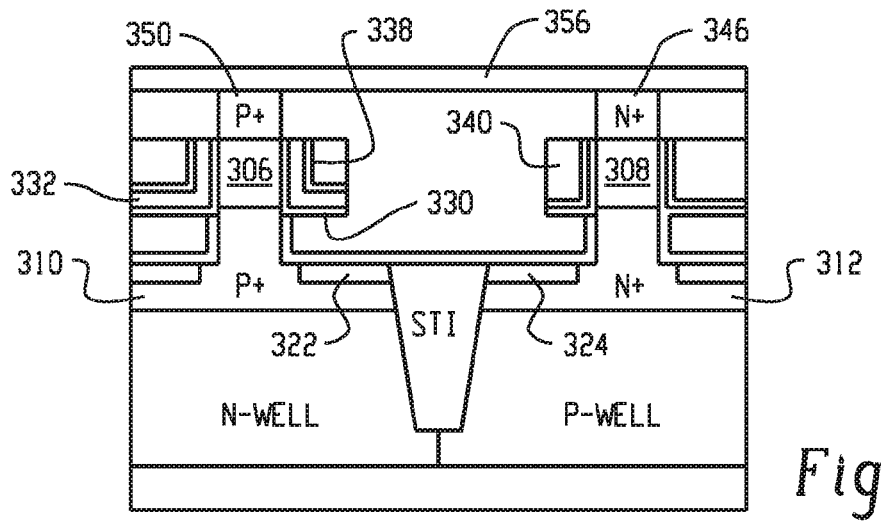
Figure 6F:
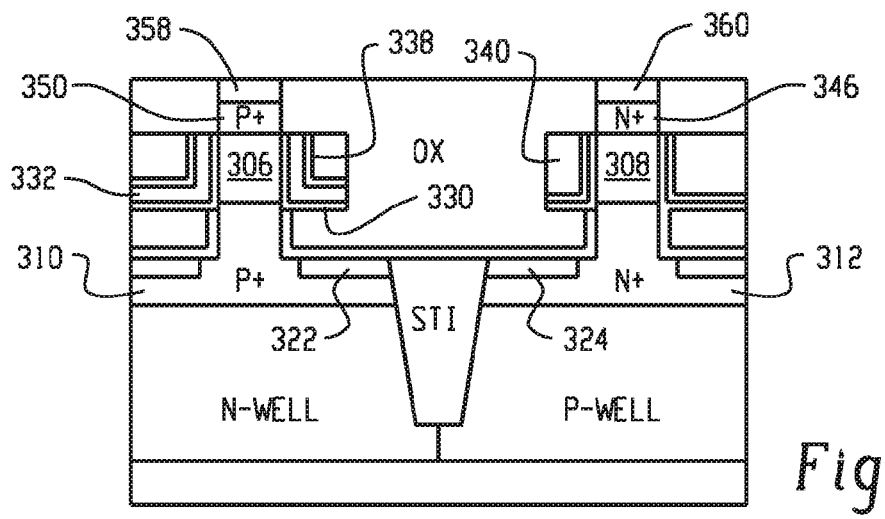

A metal-containing material 356 is formed on the wafer, as shown in FIG. 6(E). For example, the metal-containing material 356 includes Ti or Ni(Pt) with a TiN cap layer. An annealing process is performed to form a top source/drain contact region 358 associated with the nanowire 306 and a top source/drain contact region 360 associated with the nanowire 308. For example, the top source/drain contact regions 358 and 360 (e.g., silicides) are formed through a self-aligned silicidation process of the top source/drain regions 350 and 346, respectively. The un-reacted material layer 356 is removed, e.g., through wet etching, as shown in FIG. 6(F).

Figure 7A:
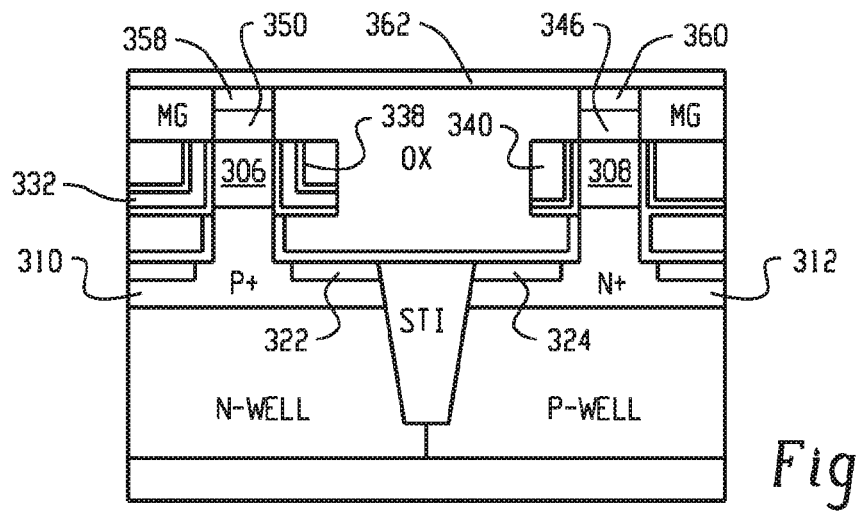
Figure 7B:
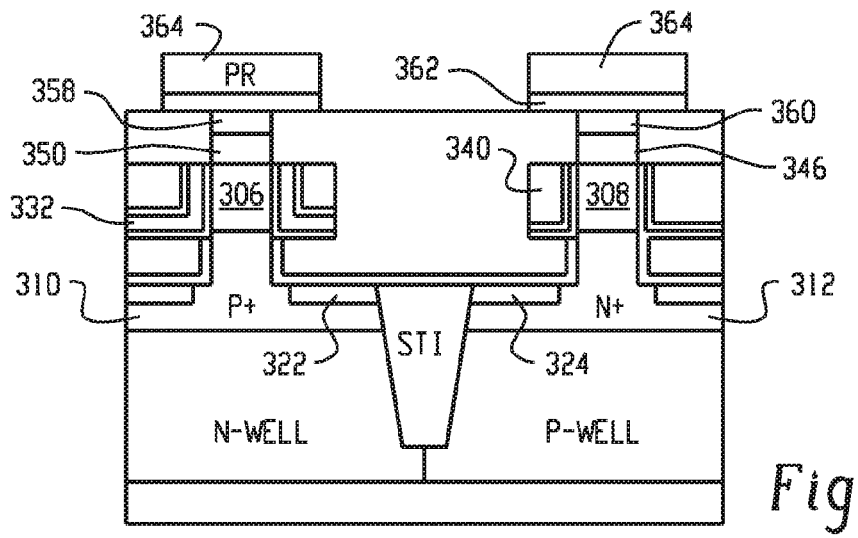
Figure 7C:
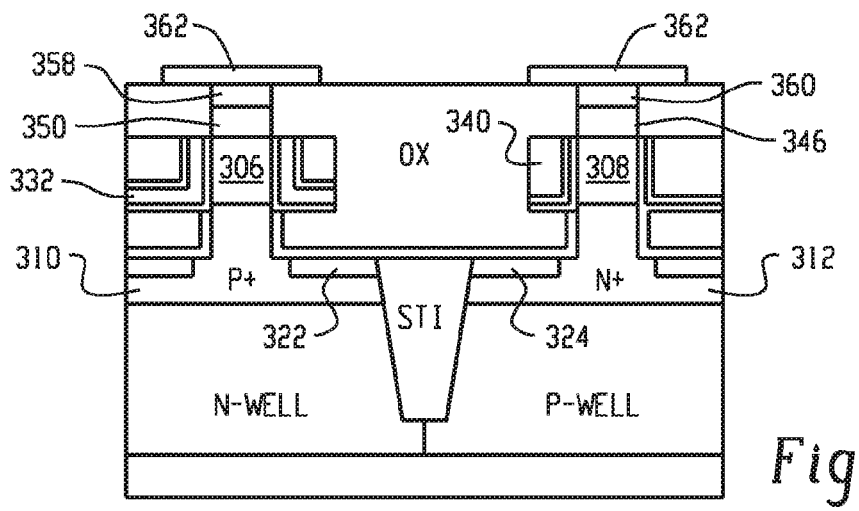

FIG. 7(A)-FIG. 7(F) depict example diagrams showing a process for forming top metal platens, in accordance with some embodiments. As shown in FIG. 7(A), a top metal material 362 is formed on the wafer. For example, the top metal material 362 includes titanium, titanium nitride, tungsten, aluminum, cobalt, copper, or other suitable materials. A photoresist layer 364 is formed and part of the photoresist layer 364 is removed to expose part of the top metal material 362. The exposed top metal material 362 is removed, e.g., through dry etching, as shown in FIG. 7(B). The remaining photoresist layer 364 is removed, as shown in FIG. 7(C).

Figure 7D:
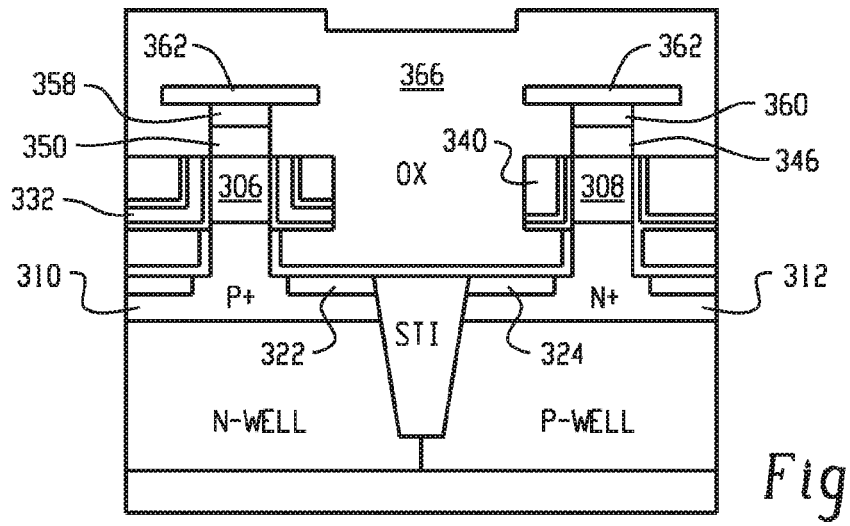
Figure 7E:
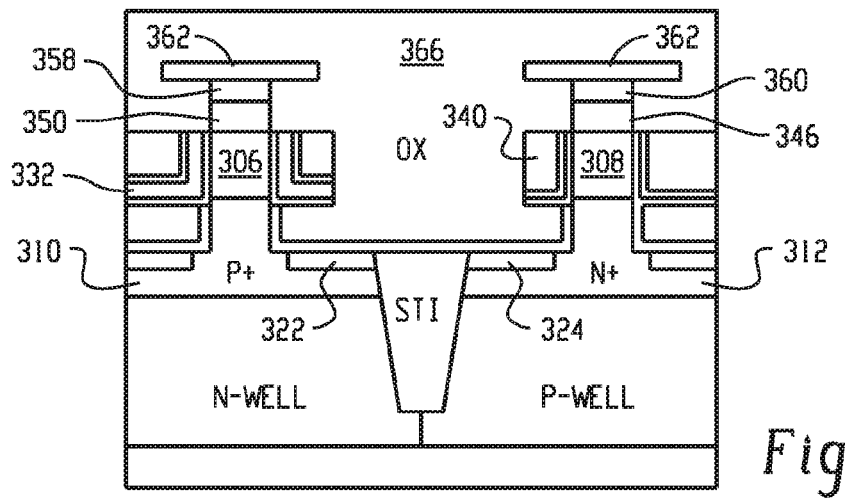
Figure 7F:
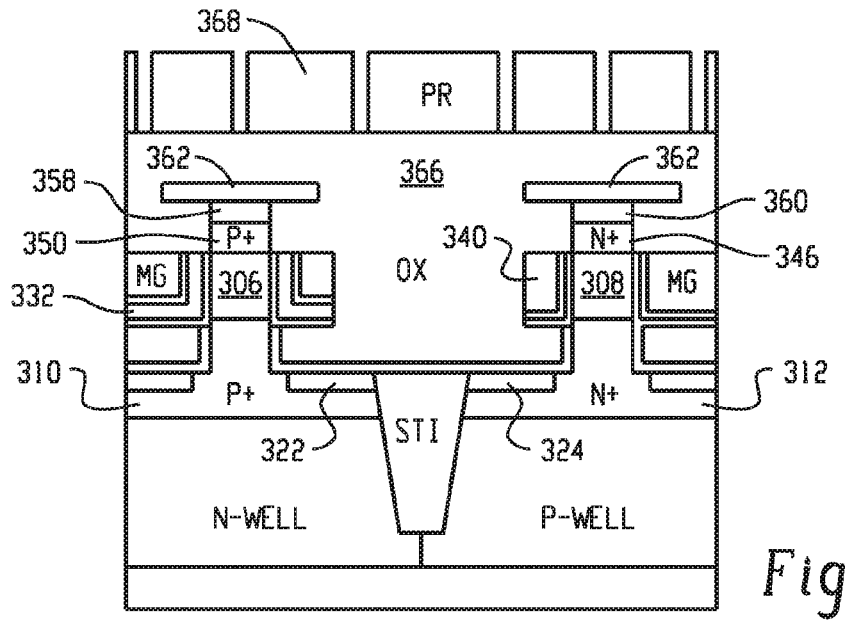

An inter-layer-dielectric (ILD) layer 366 (e.g., oxides) is formed on the wafer, as shown in FIG. 7(D). A CMP process is performed to remove part of the ILD layer 366, as shown in FIG. 7(E). Another photoresist layer 368 is formed on the ILD layer 366, and patterned through lithography for source/drain/gate contact metal formation, as shown in FIG. 7(F).

Figure 8A:
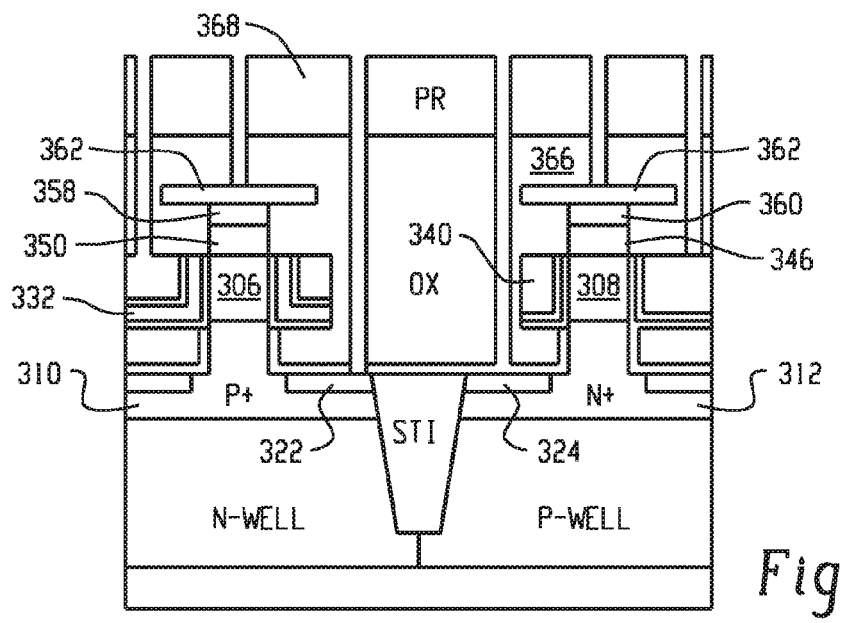
Figure 8B:
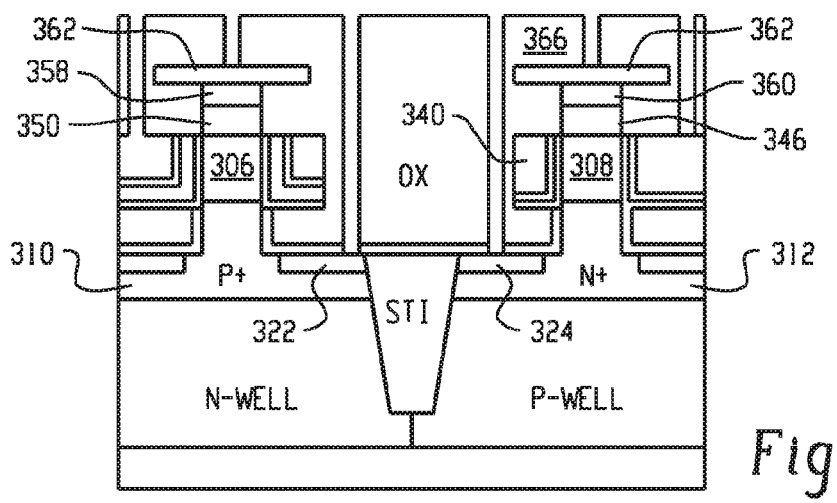
Figure 8C:
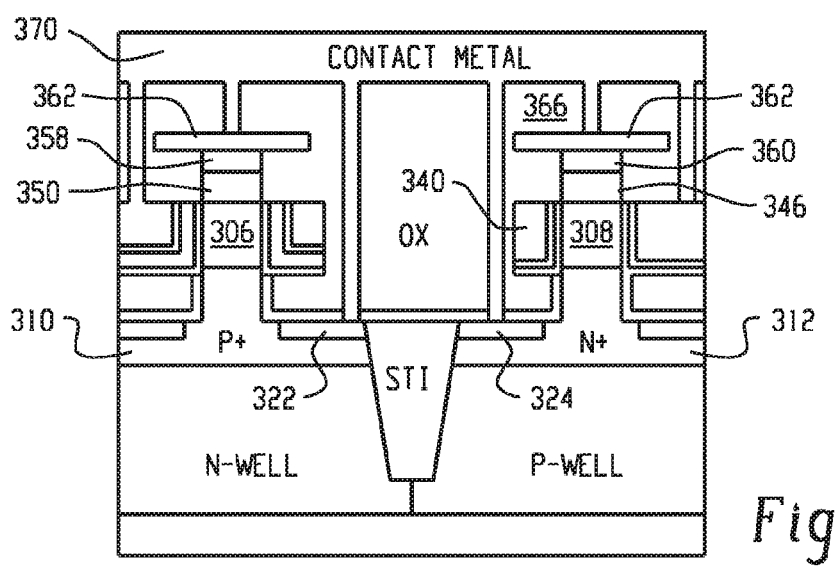
Figure 8D:
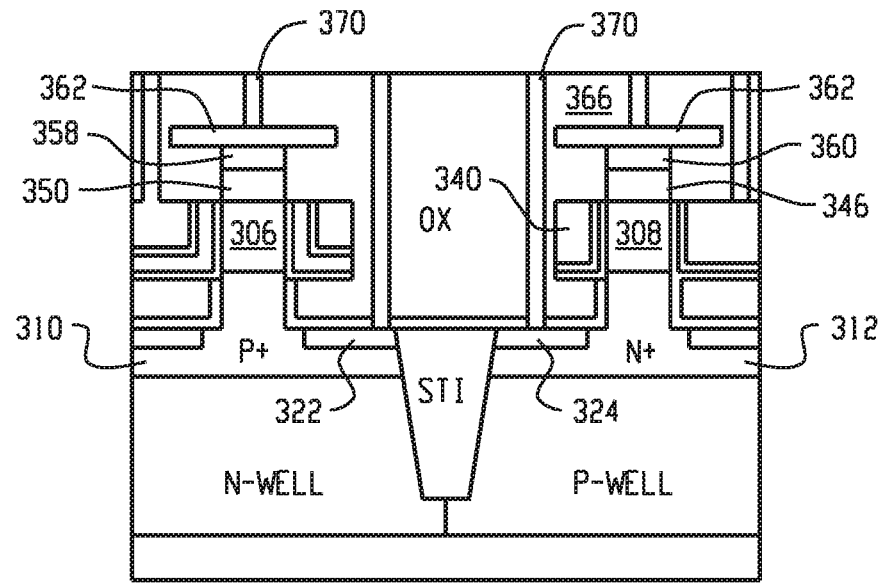
Figure 8E:
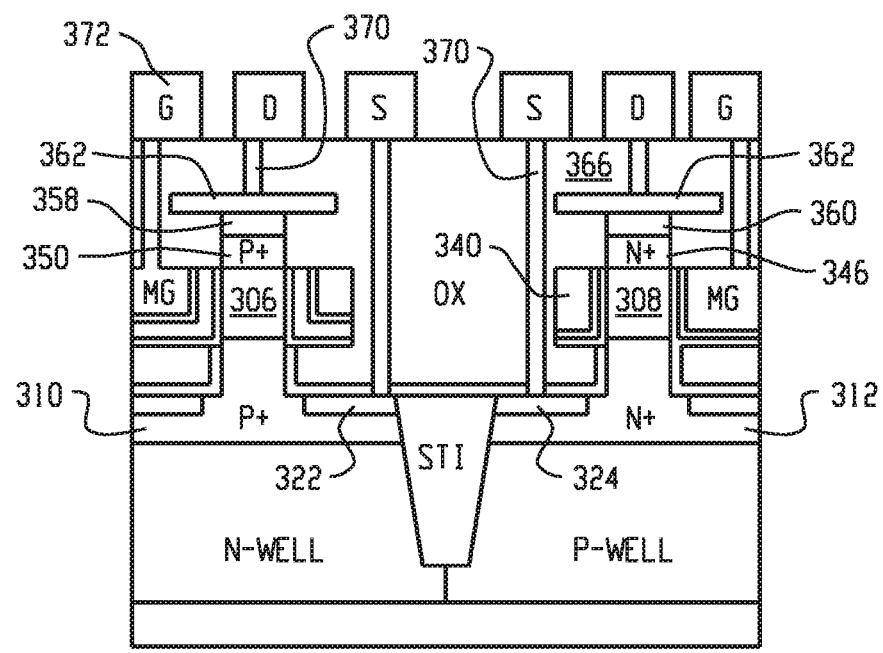

FIG. 8(A)-FIG. 8(E) depict example diagrams showing a process for source/drain/gate contact metal formation and back-end-of-line (BEOL) interconnect formation, in accordance with some embodiments. As shown in FIG. 8(A), the patterned photoresist layer 368 is used as a mask for removing part of the ILD layer 366. The remaining photoresist layer 368 is removed, as shown in FIG. 8(B). One or more contact metal materials 370 (e.g., Ti/TiN/W) are formed, as shown in FIG. 8(C). A CMP process is performed to remove part of the contact metal materials 370 to form source/drain/gate contact structures, as shown in FIG. 8(D). Interconnect structures 372 (e.g., copper) are formed during one or more BEOL interconnect processes, as shown in FIG. 8(E).

To improve the quality of the source/drain contacts (e.g., to reduce the contact resistance), the bottom source/drain contact regions can be formed at a late stage of the fabrication process as shown in FIG. 9(A)-FIG. 11(E), in accordance with some embodiments.

Figure 9A:
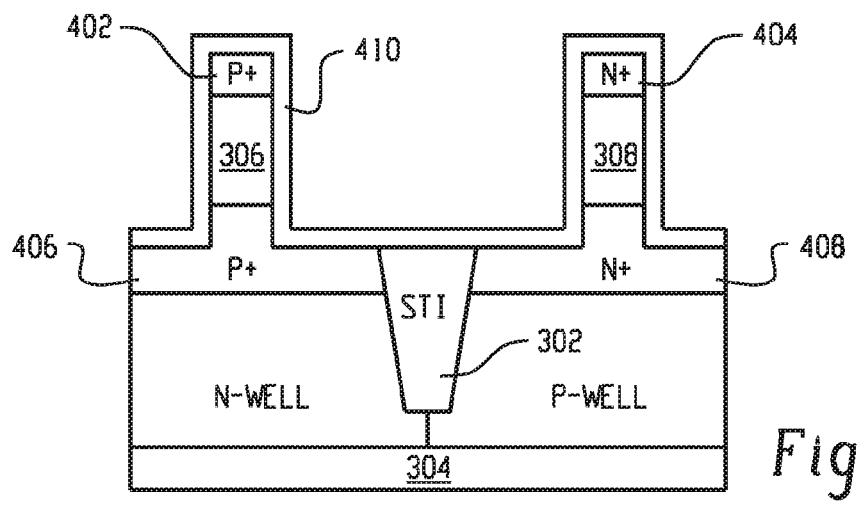
FIG. 9(A)-FIG. 11(E) depict example diagrams showing another process for fabricating multiple nanowire transistors on a substrate where bottom source/drain contact regions are formed at a late stage of the process, in accordance with some embodiments.
Figure 9B:
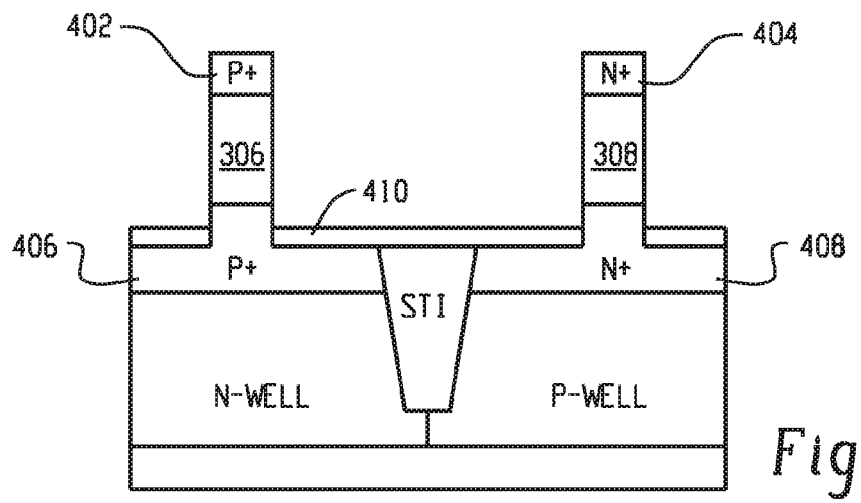

Specifically, the hard-mask materials 314 and 316 as shown in FIG. 3(A) may be removed before source/drain ion implantation, so that both the top source/drain regions and the bottom source/drain regions can be formed simultaneously (e.g., approximately) through ion implantation and doping activation. FIG. 9(A)-FIG. 9(E) depict example diagrams showing a process for forming an isolation layer, in accordance with some embodiments. As shown in FIG. 9(A), a top source/drain region 402 and a bottom source/drain region are formed for the nanowire 306 simultaneously (e.g., approximately) through ion implantation and doping activation. In addition, a top source/drain region 404 and a bottom source/drain region 408 are formed for the nanowire 308 simultaneously (e.g., approximately) through ion implantation and doping activation. Thereafter, a first dielectric material 410 is formed, e.g., through deposition, on the wafer. For example, the first dielectric material 410 includes silicon oxides or other suitable materials and has a thickness in a range of about 0.5 nm to about 100 nm. Part of the first dielectric material 410 is removed, e.g., through etching, as shown in FIG. 9(B). For example, a thin BARC layer may be formed to protect part of the first dielectric material 410.

Figure 9C:
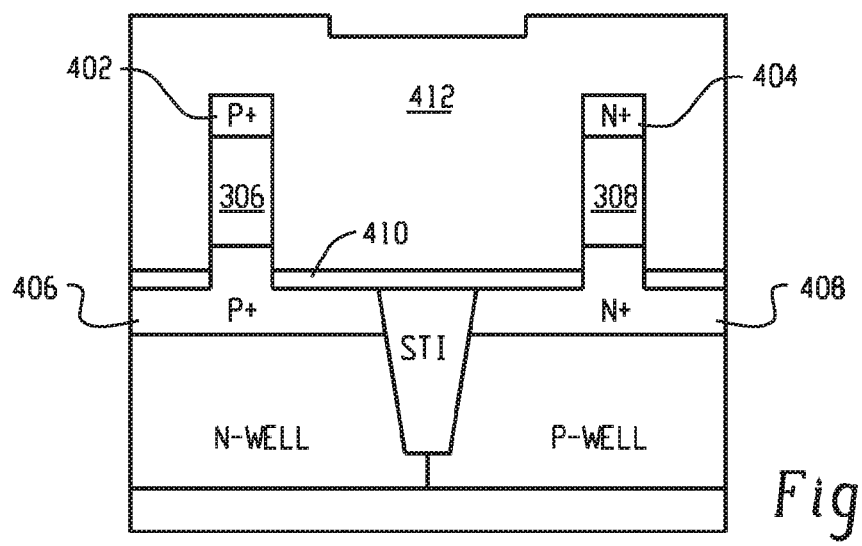
Figure 9D:
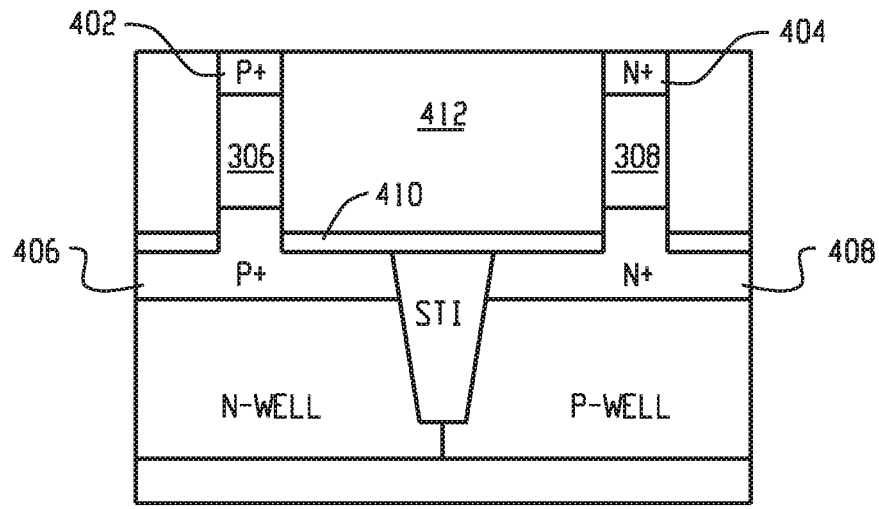
Figure 9E:
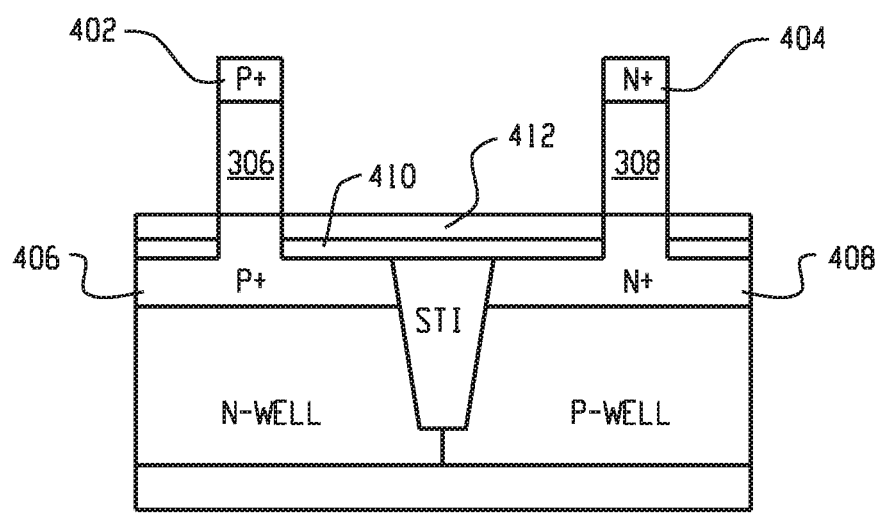

As shown in FIG. 9(C), a second dielectric material 412 is formed, e.g., through deposition, on the wafer. For example, the second dielectric material 412 includes: silicon nitride (SiN), silicon carbon nitride (SiCN), silicon carbide (SiC), silicon oxycarbide (SiOC), silicon oxide carbon nitride (SiOCN), or other suitable materials. The second dielectric material 412 has a thickness in a range of about 0.5 nm to about 500 nm. As shown in FIG. 9(D), a CMP process is performed to remove part of the second dielectric material 412 and stops at the top surfaces of the top source/drain regions 402 and 404. As shown in FIG. 9(E), the second dielectric material 412 is further removed, e.g., through etching, to form an isolation layer that includes both the first dielectric material 410 and the second dielectric material 412.

Figure 10A:
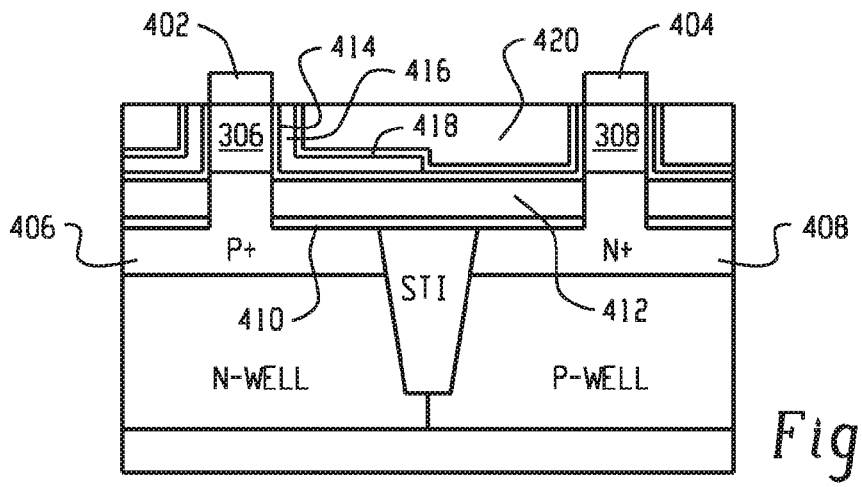

Gate structures are subsequently formed (e.g., similar to the process shown in FIG. 4(A)-FIG. 4(F)). As shown in FIG. 10(A), a gate dielectric material 414 including an interfacial layer and a high-k dielectric material is formed on the wafer, and a p-type-work-function metal material 416 is formed on the gate dielectric material 414.

Part of the p-type-work-function-metal material 416 is exposed (e.g., through BARC layer deposition, lithography and etching). The exposed p-type-work-function-metal material 416 is removed, e.g., through etching. An n-type-work-function-metal material 418 is formed on the wafer. A gate contact material 420 is formed on the n-type-work-function-metal material 418. A CMP process is carried out to remove part of the gate contact material 420 and part of the n-type-work-function-metal material 418. Part of the gate contact material 420, part of the n-type-work-function-metal material 418 and part of the p-type-work-function-metal material 416 are removed, e.g., through dry etching, as shown in FIG. 10(A).

Figure 10B:
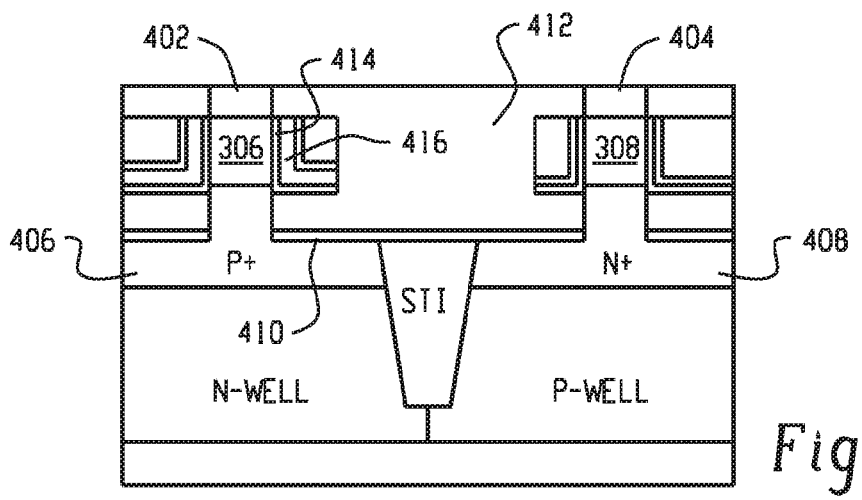
Figure 10C:
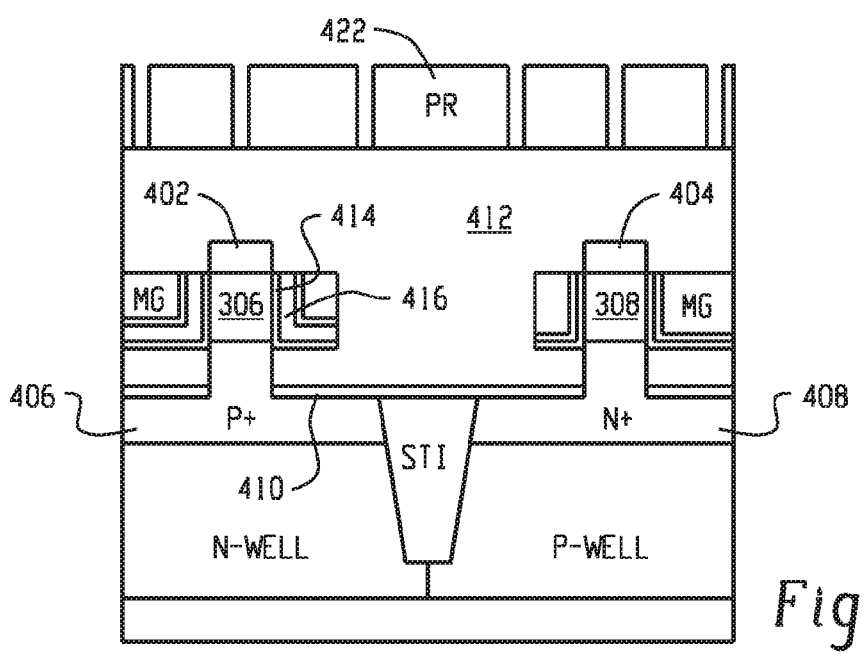

Further, part of the gate contact material 420, part of the n-type-work-function-metal material 418 and part of the p-type-work-function-metal material 416 are removed, e.g., through lithography and etching (e.g., similar to the process shown in FIG. 6(A)-FIG. 6(D)), and the process stops at the top surface of the isolation layer that includes both the first dielectric material 410 and the second dielectric material 412. Another layer of the second dielectric material 412 is formed on the wafer. A CMP process is performed to remove part of the second dielectric material 412 and stops at the top surfaces of the top source/drain regions 402 and 404, as shown in FIG. 10(B). An additional layer of the second dielectric material 412 is formed on the wafer, and contact patterning (e.g., for source contacts, drain contacts, gate contacts, etc.) is performed using a photoresist layer 422, as shown in FIG. 10(C).

Figure 10D:
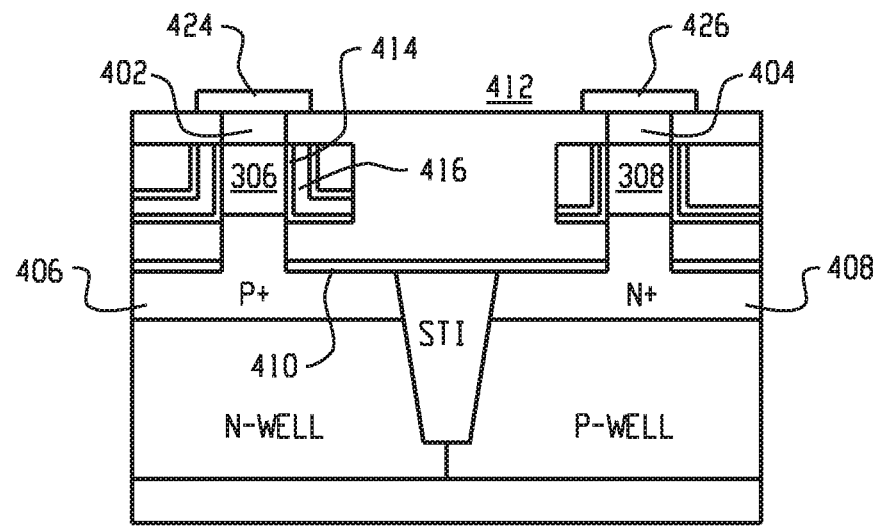
Figure 10E:
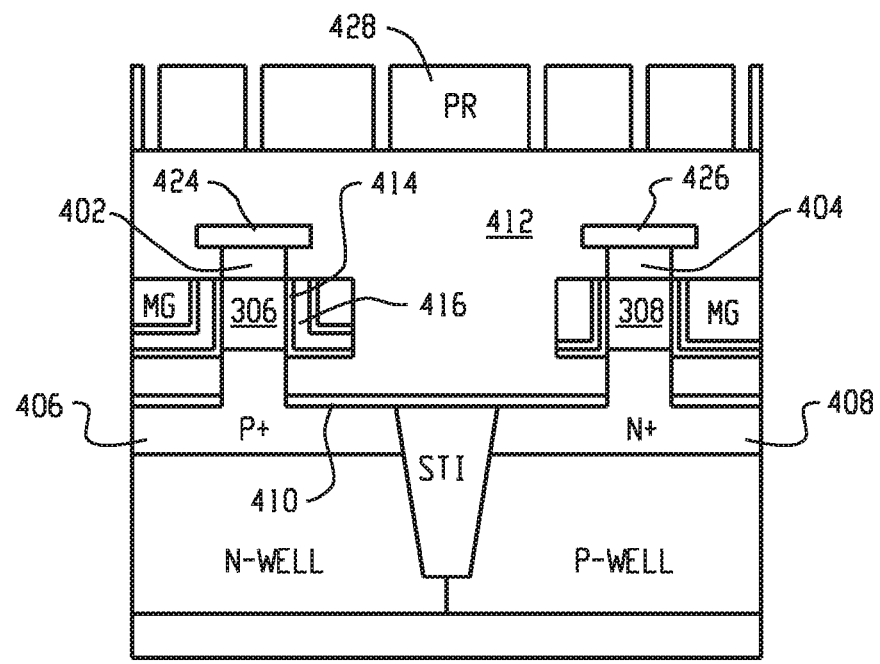

In certain embodiments, local source/drain pads 424 and 426 are formed on top of the top source/drain regions 402 and 404 respectively, as shown in FIG. 10(D). For example, a silicon layer is formed through low-temperature deposition, and a metal-containing material (e.g., Ti or Ni(Pt) with a TiN cap layer) is formed on the silicon layer. The silicon layer and the metal-containing material are patterned through lithography and etching. An annealing process is performed to form the local source/drain pads 424 and 426 (e.g., silicides). Thereafter, an additional layer of the second dielectric material 412 is formed on the wafer, and contact patterning (e.g., for source contacts, drain contacts, gate contacts, etc.) is performed using a photoresist layer 428, as shown in FIG. 10(E).

Figure 11A:
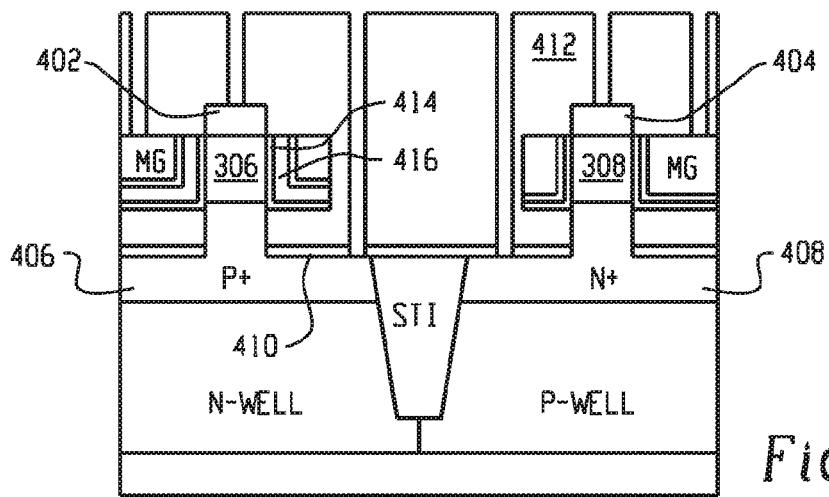
Figure 11B:
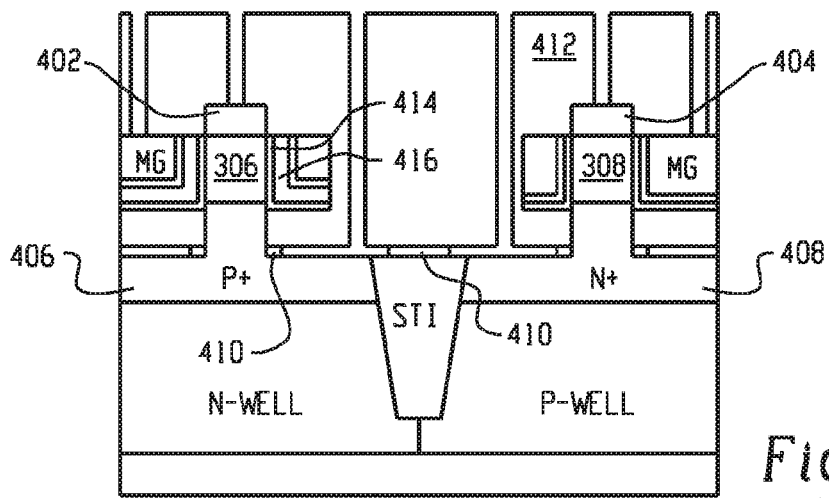

FIG. 11(A)-FIG. 11(E) depict example diagrams showing a process for forming bottom source/drain contact regions, in accordance with some embodiments. The patterned photoresist layer 422 is used as a mask for removing part of the second dielectric material 412 (e.g., through etching), and the remaining photoresist layer 422 is removed, as shown in FIG. 11(A). A pre-cleaning process is performed to remove part of the first dielectric material 410 under the second dielectric material 412, as shown in FIG. 11(B). For example, the pre-cleaning process corresponds to a selective etching process using wet etching or dry etching (e.g., plasma etching). The first dielectric material 410 has a first etch rate during the pre-cleaning process, and the second dielectric material 412 has a second etch rate during the pre-cleaning process. The second etch rate is much smaller than the first etch rate.

Figure 11C:
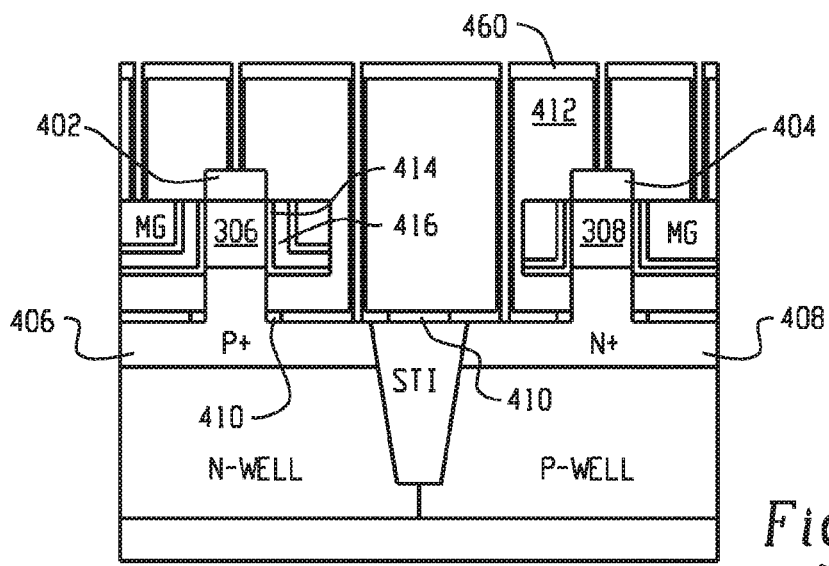
Figure 11D:
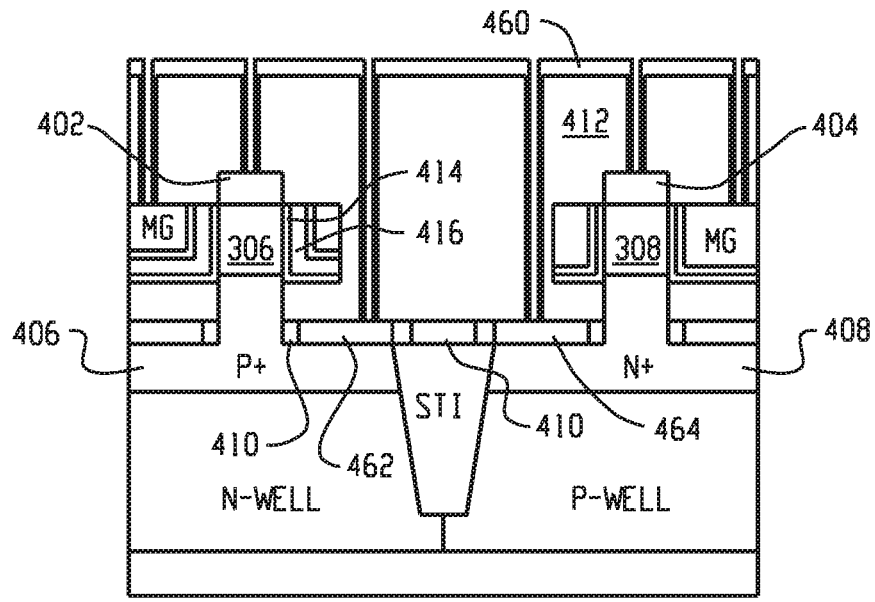
Figure 11E:
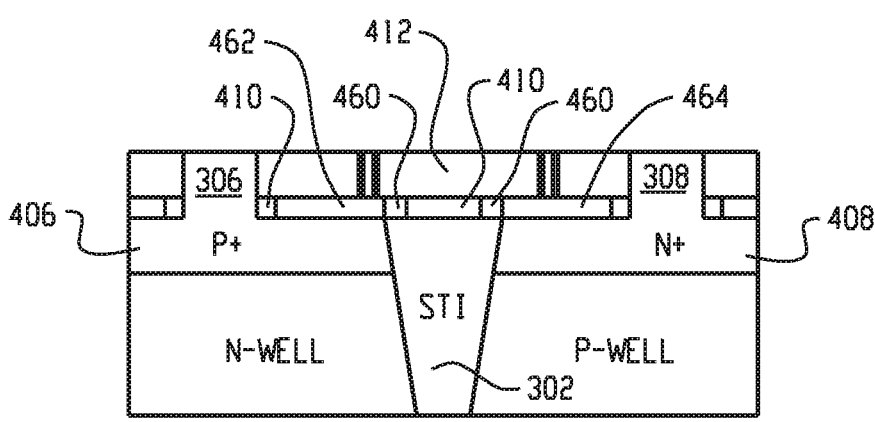
Figure 12A:
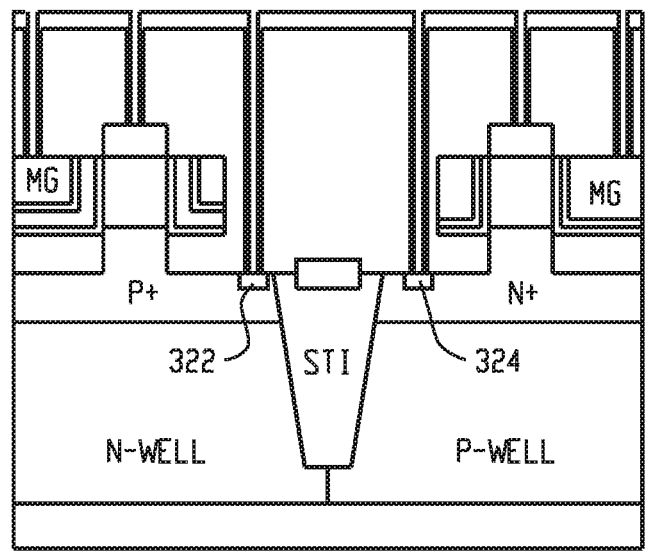
FIG. 12(A) and FIG. 12(B) depict example diagrams showing bottom source/drain contact regions formed at an early stage of a fabrication process and bottom source/drain contact regions formed at a late stage of a fabrication process respectively, in accordance with some embodiments.
Figure 12B:
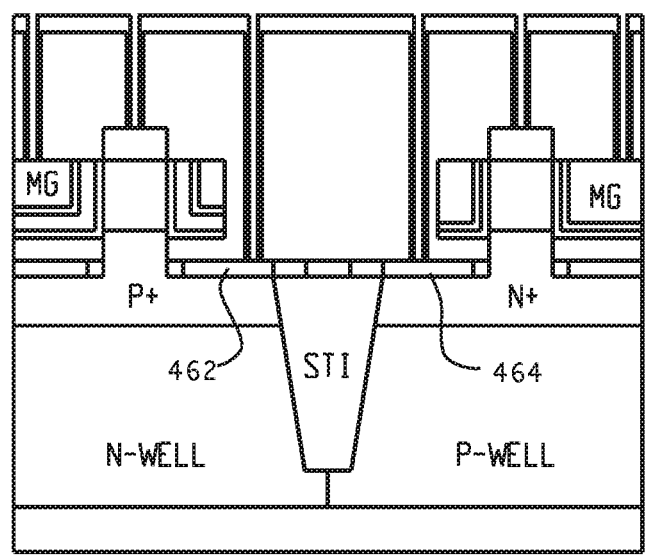

A metal-containing material 460 is formed on the wafer (e.g., through chemical vapor deposition), as shown in FIG. 11(C). For example, the metal-containing material 460 includes titanium-based materials. An annealing process is performed to form bottom source/drain contact regions 462 and 464 (e.g., silicides) associated with the nanowires 306 and 308 respectively. The un-reacted metal-containing material 460 remains on the STI structure 302 (e.g., between the bottom source/drain contact region 462 and the first dielectric material 410, and between the bottom source/drain contact region 464 and the first dielectric material 410). For example, the distance between the nanowire 306 and the bottom source/drain contact region 462 (e.g., the width of the remaining first dielectric material 410 on the bottom source/drain region 406) is in a range of about 0.5 nm to about 100 nm. The distance between two parts of the un-reacted metal-containing material 460 on the STI structure 302 (e.g., the width of the remaining first dielectric material 410 on the STI structure 302) is in a range of about 0.5 nm to about 100 nm.

In some embodiments, a glue layer and/or contact metal materials (e.g., Ti/TiN/W) are formed. A CMP process is performed to remove part of the contact metal materials to form source/drain/gate contact structures. In addition, interconnect structures (e.g., copper) are formed during one or more BEOL interconnect processes.

FIG. 12(A) and FIG. 12(B) depict example diagrams showing bottom source/drain contact regions formed at an early stage of a fabrication process and bottom source/drain contact regions formed at a late stage of a fabrication process respectively, in accordance with some embodiments. As shown in FIG. 12(A) and FIG. 12(B), the bottom source/drain contact regions 462 and 464 have larger contact areas and thus smaller contact resistance compared with the bottom source/drain contact regions 322 and 324.

Figure 13:
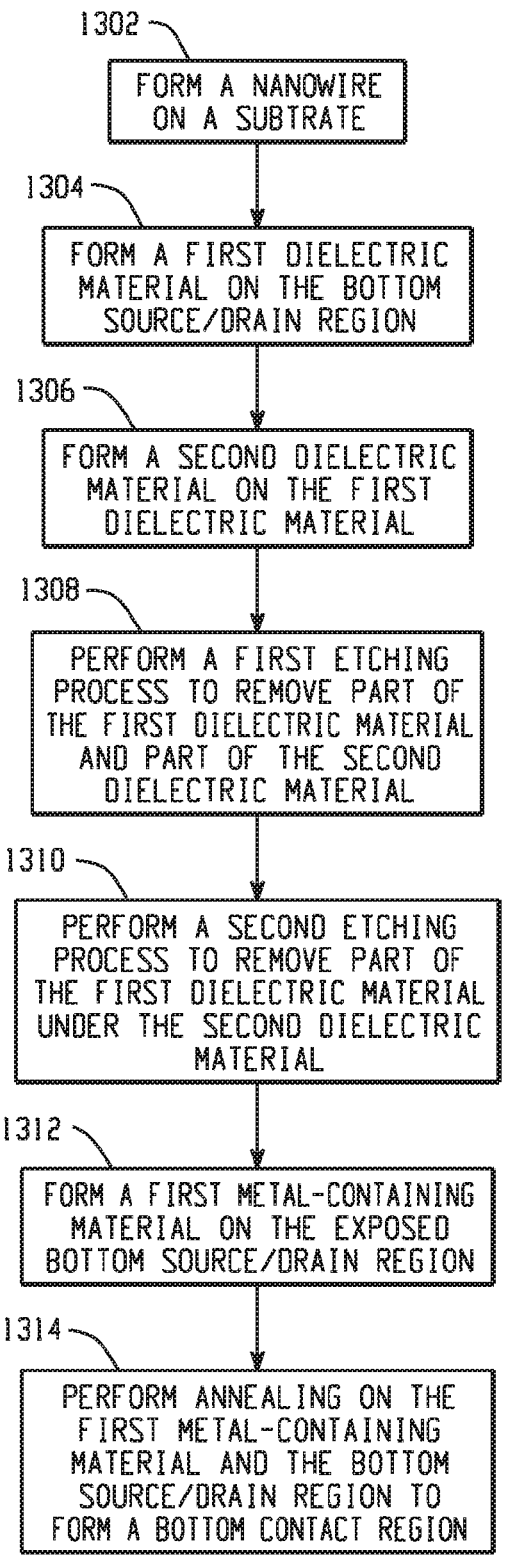
FIG. 13 depicts an example flow chart for forming bottom source/drain contact regions for nanowire devices, in accordance with some embodiments.

FIG. 13 depicts an example flow chart for forming bottom source/drain contact regions for nanowire devices, in accordance with some embodiments. At 1302, a nanowire is formed on a substrate. The nanowire extends substantially vertically relative to the substrate and is disposed between a top source/drain region and a bottom source/drain region. At 1304, a first dielectric material is formed on the bottom source/drain region. At 1306, a second dielectric material is formed on the first dielectric material. At 1308, a first etching process is performed to remove part of the first dielectric material and part of the second dielectric material to expose part of the bottom source/drain region. At 1310, a second etching process is performed to remove part of the first dielectric material under the second dielectric material to further expose the bottom source/drain region. At 1312, a first metal-containing material is formed on the exposed bottom source/drain region. At 1314, annealing is performed on the first metal-containing material and the bottom source/drain region to form a bottom contact region.

Figure 14:
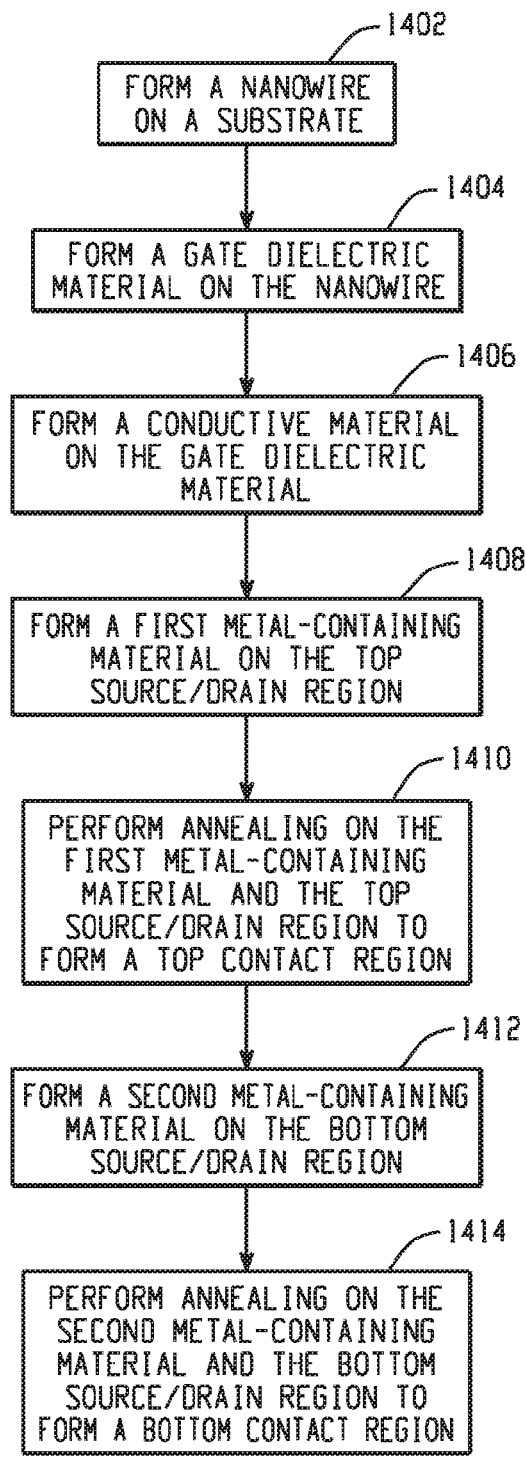
FIG. 14 depicts another example flow chart for forming bottom source/drain contact regions for nanowire devices, in accordance with some embodiments.

FIG. 14 depicts another example flow chart for forming bottom source/drain contact regions for nanowire devices, in accordance with some embodiments. At 1402, a nanowire is formed on a substrate. The nanowire extends substantially vertically relative to the substrate and is disposed between a top source/drain region and a bottom source/drain region. At 1404, a gate dielectric material is formed on the nanowire. At 1406, a conductive material is formed on the gate dielectric material. At 1408, a first metal-containing material is formed on the top source/drain region. At 1410, annealing is performed on the first metal-containing material and the top source/drain region to form a top contact region. At 1412, a second metal-containing material is formed on the bottom source/drain region. At 1414, annealing is performed on the second metal-containing material and the bottom source/drain region to form a bottom contact region.

The present disclosure describes formation of bottom source/drain contact regions for nanowire devices using processes compatible with a CMOS process flow. In some embodiments, the structures and methods described herein are configured to improve contact quality and reduce contact resistance.

According to one embodiment, a method is provided for forming bottom source/drain contact regions for nanowire devices. A nanowire is formed on a substrate. The nanowire extends substantially vertically relative to the substrate and is disposed between a top source/drain region and a bottom source/drain region. A first dielectric material is formed on the bottom source/drain region. A second dielectric material is formed on the first dielectric material. A first etching process is performed to remove part of the first dielectric material and part of the second dielectric material to expose part of the bottom source/drain region. A second etching process is performed to remove part of the first dielectric material under the second dielectric material to further expose the bottom source/drain region. A first metal-containing material is formed on the exposed bottom source/ drain region. Annealing is performed on the first metal-containing material and the bottom source/drain region to form a bottom contact region.

According to another embodiment, a method is provided for forming bottom source/drain contact regions for nanowire devices. A nanowire is formed on a substrate. The nanowire extends substantially vertically relative to the substrate and is disposed between a top source/drain region and a bottom source/drain region. A gate dielectric material is formed on the nanowire. A conductive material is formed on the gate dielectric material. A first metal-containing material is formed on the top source/drain region. Annealing is performed on the first metal-containing material and the top source/drain region to form a top contact region. A second metal-containing material is formed on the bottom source/drain region. Annealing is performed on the second metal-containing material and the bottom source/drain region to form a bottom contact region.

According to yet another embodiment, a structure includes: a first nanowire, a second nanowire, a shallow-trench-isolation structure, a first contact region and a second contact region. The first nanowire is formed on a substrate. The first nanowire extends substantially vertically relative to the substrate and is disposed between a first top source/drain region and a first bottom source/drain region. The second nanowire is formed on the substrate. The second nanowire extends substantially vertically relative to the substrate and is disposed between a second top source/drain region and a second bottom source/drain region. The shallow-trench-isolation structure is formed between the first bottom source/drain region and the second bottom source/drain region. The first contact region is formed on the first bottom source/drain region, where the first contact region is adjacent to a first metal-containing material on the STI structure. The second contact region is formed on the second bottom source/drain region, where the second contact region is adjacent to the first metal-containing material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating nanowire devices on a substrate, the method comprising:
   forming a nanowire on a substrate, the nanowire extending substantially vertically relative to the substrate and being disposed between a top source/drain region and a bottom source/drain region;
   forming a first dielectric material layer on the bottom source/drain region;
   forming a second dielectric material layer on the first dielectric material layer;
   performing a first etching process to remove part of the first dielectric material layer and part of the second dielectric material layer to expose part of the bottom source/drain region;
   performing a second etching process to remove part of the first dielectric material layer and create an undercut between the substrate and the second dielectric material layer;
   forming a first metal-containing material on the bottom source/drain region through the undercut; and
   performing annealing on the first metal-containing material and the bottom source/drain region to form a bottom contact region.

2. The method of claim 1, wherein:
   the first dielectric material layer has a first etch rate during the second etching process; and
   the second dielectric material layer has a second etch rate during the second etching process, the second etch rate being smaller than the first etch rate.

3. The method of claim 1, wherein:
   the first dielectric material layer includes an oxide; and
   the second dielectric material layer comprises at least one of silicon nitride (SiN), silicon carbon nitride (SiCN), silicon carbide (SiC), silicon oxycarbide (SiOC), and silicon oxide carbon nitride (SiOCN).

4. The method of claim 1, wherein the top source/drain region and the bottom source/drain region are formed substantially simultaneously through ion implantation.

5. The method of claim 4, wherein the first dielectric material layer is formed after the ion implantation.

6. The method of claim 1, further comprising:
   forming a gate dielectric material on the nanowire; and
   forming a conductive material on the gate dielectric material;
   wherein an isolation layer is formed based on the first dielectric material and the second dielectric material to separate the conductive material from the bottom source/drain region.

7. The method of claim 1, further comprising:
   forming a second metal-containing material on the top source/drain region; and
   performing annealing on the second metal-containing material and the top source/drain region to form a top contact region.

8. The method of claim 1, wherein the substrate includes at least one of the following: silicon, silicon germanium, germanium and III-V materials.

9. The method of claim 1, wherein the first metal-containing material is formed through deposition.

10. The method of claim 1, wherein the bottom contact region is formed through a silicidation process.

11. A method for fabricating nanowire devices on a substrate, the method comprising:
    forming a nanowire on a substrate, the nanowire extending substantially vertically relative to the substrate and being disposed between a top source/drain region and a bottom source/drain region;
    forming a gate layer that surrounds the nanowire, wherein the forming a gate layer includes
       forming a gate dielectric material on the nanowire, and
       forming a conductive material on the gate dielectric material;
       forming a first metal-containing material on the top source/drain region;
    performing annealing on the first metal-containing material and the top source/drain region to form a top contact region;
    forming a second metal-containing material on the bottom source/drain region, wherein the forming a second metal-containing material on the bottom source/drain includes forming a first dielectric material layer on the bottom source/drain region, forming a second dielectric material layer on the first dielectric material layer, performing a first etching process to remove part of the first dielectric material layer and part of the second dielectric material layer to expose part of the bottom source/drain region, performing a second etching process to remove part of the first dielectric material layer and create an undercut between the substrate and the second dielectric material layer, and forming the second metal-containing material on the bottom source/drain region through the undercut; and performing annealing on the second metal-containing material and the bottom source/drain region to form a bottom contact region.

12. The method of claim 11, wherein:
the first dielectric material layer has a first etch rate during the second etching process; and
the second dielectric material layer has a second etch rate during the second etching process, the second etch rate being smaller than the first etch rate.

13. The method of claim 11, wherein:
the first dielectric material layer includes an oxide; and
the second dielectric material layer includes at least one of silicon nitride (SiN), silicon carbon nitride (SiCN), silicon carbide (SiC), silicon oxycarbide (SiOC), and silicon oxide carbon nitride (SiOCN).

14. The method of claim 11, wherein the top source/drain region and the bottom source/drain region are formed substantially simultaneously through ion implantation.

15. The method of claim 11, wherein the substrate includes one or more of the following: silicon, silicon germanium, germanium and III-V materials.

16. The method of claim 11, wherein the second metal-containing material is formed through deposition.

17. The method of claim 11, wherein the bottom contact region is formed through a silicidation process.

18. A method of fabricating contacts for vertical channel device, comprising:
providing a nanowire structure extending substantially vertically on a substrate, the nanowire structure defining a vertical channel direction between a top device region and a bottom device region;
disposing a sacrificial spacing layer of a first dielectric material over the substrate around a root portion of the nanowire structure;
disposing an interlayer of a second dielectric material on the sacrificial spacing layer;
performing a first etching process through the spacing layer and the interlayer to expose part of the bottom device region;
performing a second etching process to remove at least part of the spacing layer and create an undercut between the substrate and the interlayer; and
forming a contact to the bottom device region through the undercut.

19. The method of claim 18, wherein performing the first etching process comprises forming a contact via through the spacing layer and the interlayer to expose a selective region of the device.

* * * * *